(12) United States Patent
Park

(10) Patent No.: US 8,243,483 B2
(45) Date of Patent: Aug. 14, 2012

(54) MEMORY DEVICE CAPABLE OF ONE-TIME DATA WRITING AND REPEATED DATA REPRODUCTION, AND METHOD AND DISPLAY APPARATUS FOR OPERATING THE MEMORY DEVICE

(75) Inventor: Youngsoo Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 123 days.

(21) Appl. No.: 12/382,034

(22) Filed: Mar. 6, 2009

(65) Prior Publication Data
US 2009/0262563 A1 Oct. 22, 2009

(30) Foreign Application Priority Data
Apr. 22, 2008 (KR) .................. 10-2008-0037318

(51) Int. Cl.
*G11C 5/02* (2006.01)

(52) U.S. Cl. ............... 365/51; 365/63; 365/94; 365/200

(58) Field of Classification Search .................. 365/104, 365/94
See application file for complete search history.

(56) References Cited

U.S. PATENT DOCUMENTS

| | | | | |
|---|---|---|---|---|
| 4,807,191 A * | 2/1989 | Flannagan | ................ | 714/711 |
| 5,996,106 A * | 11/1999 | Seyyedy | ................ | 714/763 |
| 6,594,169 B2 * | 7/2003 | Sakui | ................ | 365/51 |
| 6,650,577 B2 * | 11/2003 | Hartmann | ................ | 365/200 |
| 6,781,896 B2 * | 8/2004 | Lammers et al. | ............ | 365/200 |
| 7,106,639 B2 * | 9/2006 | Taussig et al. | ............ | 365/200 |
| 7,212,454 B2 * | 5/2007 | Kleveland et al. | ............ | 365/200 |
| 2007/0058923 A1 | 3/2007 | Buhler | | |
| 2007/0070690 A1 | 3/2007 | Scheuerlein et al. | | |
| 2007/0236981 A1 | 10/2007 | Herner | | |

FOREIGN PATENT DOCUMENTS

JP 2004-022904 A 1/2004
JP 2004-165632 A 6/2004

* cited by examiner

*Primary Examiner* — Tan T. Nguyen
(74) *Attorney, Agent, or Firm* — Harness, Dickey & Pierce, P.L.C

(57) ABSTRACT

Provided are a memory device where data may be recorded one time and/or reproduced repeatedly, and a method and display apparatus for operating the memory device. The memory device may include a program area having a plurality of memory cells and a spare area having a plurality of memory cells. The memory device may include a memory cell layer having the program area and the spare area. The memory cell layer may include a plurality of vertically stacked memory cell layers. Each of the plurality of memory cell layers may include the program area and the spare area. The program area and the spare area may be either vertical or horizontal to one another.

23 Claims, 20 Drawing Sheets

MEMORY DEVICE CAPABLE OF ONE-TIME DATA WRITING AND REPEATED DATA REPRODUCTION, AND METHOD AND DISPLAY APPARATUS FOR OPERATING THE MEMORY DEVICE

PRIORITY STATEMENT

This application claims priority under 35 U.S.C. §119 to Korean Patent Application No. 10-2008-0037318, filed on Apr. 22, 2008, in the Korean Intellectual Property Office (KIPO), the entire contents of which are incorporated herein by reference.

BACKGROUND

1. Field

Example embodiments relate to a memory device capable of one-time data writing and repeated data reproduction, and a method and display apparatus for operating the memory device.

2. Description of the Related Art

Conventionally, magnetic recording media, e.g., magnetic tapes or magnetic discs, have been widely used in order to record images, sounds, or various data. However, as the use of the Internet has generalized, a user may easily access various data contents, and a recording medium having a larger capacity is required. Thus, optical media, e.g., compact discs (CDs) and digital versatile discs (DVDs), have replaced the magnetic recording media.

A separate reproducing apparatus is required in order to reproduce data stored in a magnetic recording medium or an optical medium. Such a reproducing apparatus requires a driving unit that rotates a recording medium via mechanical means and a separate input/output device for recording/reading data in/from the recording medium. In addition, a separate electrical line connecting the reproducing apparatus to a display apparatus is required in order to output a reproduced image, sound, or data signal to the display apparatus.

Because a separate reproducing apparatus is required in order to reproduce image and/or sound data from a recording medium, and a complicated connection line connecting a reproducing apparatus to an external display apparatus is required, a user may be inconvenienced. To address this problem, the related art discloses a method in which information is read from and re-recorded in a flash memory by using a universal serial bus (USB) instead of a separate reproducing apparatus and a complicated connection line.

Because a flash memory that may repeatedly write and read data is used in this method, a movie file may be recorded after watching a desired movie. However, due to relatively high costs, manufacturing DVD titles and supplying them to a user in relatively large quantities may be difficult. Even if a user stores and reproduces movie data in and from a memory by using his/her computer regardless of expensive costs, a relatively long period of time is required to store a movie having an image quality similar to that of a DVD with a capacity of about 5 GB. Thus, storing various movie titles or image and/or sound information may be difficult in terms of costs and time. Thus, in order to store/reproduce a relatively large amount of data in/from a semiconductor memory, a highly integrated and inexpensive semiconductor memory capable of one-time data writing and repeated data reproduction data is better than an expensive flash memory capable of repeatedly reading and writing data.

A highly integrated and inexpensive semiconductor memory capable of one-time data writing and repeated data reproduction has been disclosed in the related art. This semiconductor memory has a lattice form and may include a steering device and an insulator, which are disposed at an intersection between a lower electrode and an upper electrode, and thus, allow a current to flow only in one direction. Because the semiconductor memory records data 1 and 0 according to whether the insulation of the insulator is broken, data may be recorded only one time, but data may be repeatedly reproduced.

However, in such a semiconductor memory, a relatively high voltage must be applied in order to break the insulation of an insulator, and whether the insulation of the insulator is accurately broken must be checked. Thus, a writing rate of such semiconductor memory is about 0.5 MB/s. Accordingly, a period of time equal to or greater than forty-five minutes is required to record a movie of high image-quality having a size of 25 GB. Thus, the above semiconductor memory is inefficient in terms of cost because a relatively long time is required to record/reproduce a title in which a relatively large amount of image and sound information are recorded.

Accordingly, another semiconductor memory capable of one-time data writing and repeated reproduction has been developed, wherein a relatively large amount of information, e.g., movie, is written in the semiconductor memory during manufacturing thereof. In this semiconductor memory, an insulator may be formed on a steering device only in a memory cell in which data 0 is recorded. Such a semiconductor memory is advantageous because a relatively large amount of information is standardized during manufacture of the semiconductor memory, and thus, the semiconductor memory may be supplied in relatively large quantities.

However, when a relatively large amount of information is recorded during manufacturing thereof, because a highly integrated memory cell is required in order to write a relatively large amount of information, a short circuit might occur due to a conductive particle and a process error which are generated during the manufacturing process, thereby leading to operational errors. In addition, because a reading rate of data from a completed semiconductor memory, that is, the data transmission rate is relatively low, obtaining a transmission rate of 39 MB/s required to reproduce a moving picture may be difficult.

SUMMARY

Example embodiments provide a memory device capable of one-time data writing and repeated data reproduction. Example embodiments also provide a display apparatus for operating the memory device. Example embodiments also provide a method of operating the memory device.

According to example embodiments, a memory device may include a program area including a plurality of memory cells; and a spare area including a plurality of memory cells, wherein at least one of at least two vertically stacked memory modules may include the program area.

Each of the at least two memory modules may comprise the program area and the spare area. Each of the at least two memory modules may be a program area. Any one of the at least two memory modules may comprise the spare area, and the other of the at least two memory modules may comprise the program area. The spare area may be spaced apart from the memory module.

Any two of the at least two memory modules may constitute a unit of memory modules. At least one memory module selected from among the at least two memory modules may comprise at least two separate memory modules horizontal to one another. The program area and the spare area may be spaced apart from each other at a predetermined or given interval. The at least two separate horizontally disposed memory modules may comprise the program area and the spare area.

Data may be dispersedly recorded in the program area and the spare area, and less than about 50% of the data may be recorded in the spare area. All of the memory cells of the program area and the spare area may be in an off-state, or portion of the memory cells of the program area and the spare area may be in an on-state, and the others of the memory cells of the program area and the spare area may be in an off-state.

The memory device may further comprise: a memory interface and controller connected to the memory module; and a main interface connected to the memory interface and controller and to an external display element. The memory device may further include an operation enhancing unit enhancing an operation of the memory device between the memory interface and controller and the main interface.

The at least two memory modules may share a wiring. An insulating layer may be between the at least two memory modules. Each of the memory cells may comprise two wirings, a diode and an insulating layer sequentially stacked between the two wirings. A portion of the memory cells may comprise only the two wirings and a diode between the two wirings. The diode may be one of a PN diode, a Schottky diode, and a back-to-back diode.

According to example embodiments, a display apparatus may include a port configured to connect to the memory device of example embodiments. The port may have a depth corresponding to the entire length or a partial length of the memory device. The port and the memory device may be connected through a cable.

According to example embodiments, a method of operating a memory device may include providing a program area including a plurality of memory cells and a spare area including a plurality of memory cells, wherein at least one of at least two memory modules includes the program area, and simultaneously reading data from the at least two memory modules.

Each of the at least two memory modules may comprise the program area and the spare area, and a portion of the data may be recorded in the spare area. At least one of the at least two memory modules may comprise the spare area and the others of the at least two memory modules may comprise the program area, and a portion of the data may be recorded in the spare area.

According example embodiments, a method of operating a memory device may include providing a program area including a plurality of memory cells and a spare area including a plurality of memory cells, wherein at least one of at least two memory modules includes the program area, and dispersedly recording data in the at least two memory modules.

The method may further comprise recording a portion of the data in the spare area. The recording of the portion of the data in the spare area may comprise checking for incorrectly recorded data from among data dispersedly recorded in the at least two memory modules; and recording correct data corresponding to the data incorrectly recorded in the spare area.

Each of the at least two memory modules may comprise the program area and the spare area. At least one of the at least two memory modules may comprise the spare area, and the others of the at least two memory modules may comprise the program area.

BRIEF DESCRIPTION OF THE DRAWINGS

Example embodiments are described in further detail below with reference to the accompanying drawings. It should be understood that various aspects of the drawings may be exaggerated for clarity.

Figure 1:
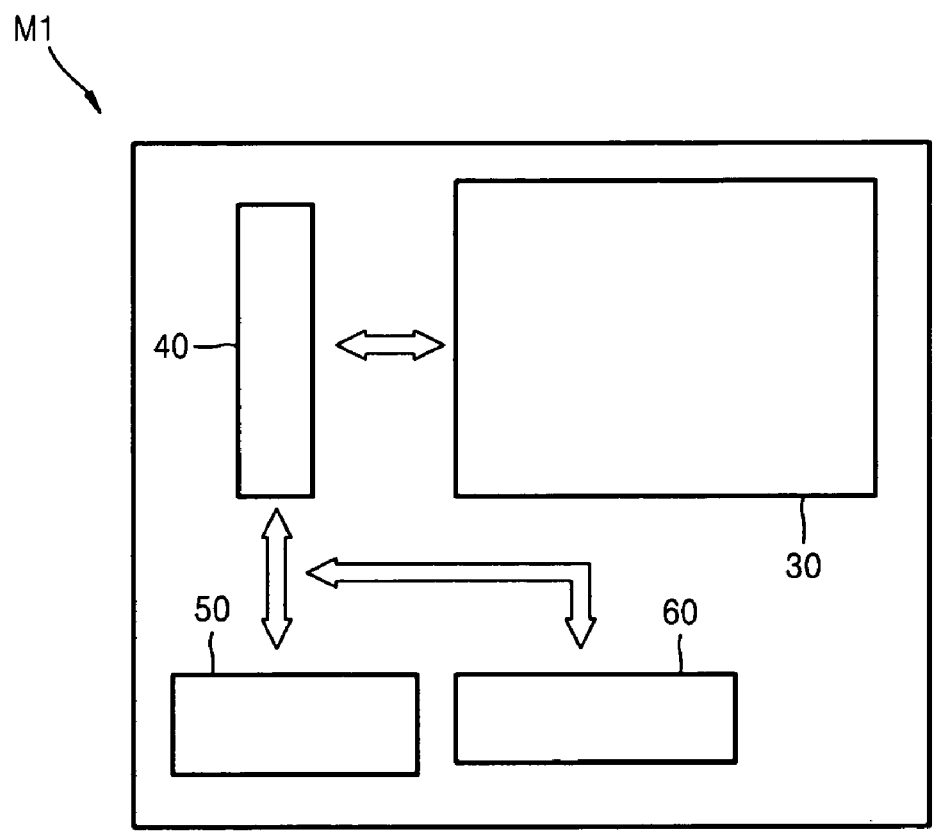
FIG. 1 is a plan view of a memory device according to example embodiments.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, a memory device capable of one-time data writing and repeated reproduction, and a method and apparatus for operating the memory device will be described with regard to example embodiments with reference to the attached drawings. In the drawings, the thicknesses of layers and regions are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

A memory device according to example embodiments will now be described. FIG. 1 illustrates a configuration of a semiconductor memory device M1 in which image and/or sound information may be stored, according to example embodiments.

Referring to FIG. 1, the semiconductor memory device M1 may include a data storage unit 30, a memory interface and controller 40, a main interface unit 50, and an operation enhancing unit 60 enhancing an operational function. The data storage unit 30 may include a program area and a spare area, which will be described later. The memory interface and controller 40 may control reproduction of data written in the data storage unit 30 and may transmit data reproduced from the data storage unit 30 to the main interface unit 50. The main interface unit 50 may be connected to a main system (not shown) and may transmit data transmitted from the memory interface and controller 40 to the main system. The main system may be a display apparatus displaying data stored in the data storage unit 30 to an external element. An example of the main system may be a television or a projection apparatus. The data may be at least one of image, sound, and character data. The memory interface and controller 40 may have various functions according to the use of the data storage unit 30.

In particular, if the semiconductor memory device M1 is a mask read only memory (ROM), when data is recorded in the data storage unit 30 during manufacturing of the semiconductor memory device M1, the memory interface and controller 40 may perform only a function related to reproduction of data recorded in the data storage unit 30. However, after manufacturing the semiconductor memory device M1, when data is recorded in the data storage unit 30 by an external device, e.g., the main system, the memory interface and controller 40 may perform an operation related to recording data in addition to an operation of reproduction of data, for example, recording data or replacing a memory cell having a defect generated during the recordation of data by a memory cell in the spare area. These operations may be performed by a repair circuit. During manufacturing of the semiconductor memory device M1, when predetermined or given data, e.g., a movie, is recorded in the data storage unit 30, the repairing circuit may be positioned outside of the semiconductor memory device M1. However, after manufacturing the semiconductor memory device M1, when predetermined or given data is recorded in the semiconductor memory device M1 by a predetermined or given device, the repairing circuit may be mounted in the semiconductor memory device M1. The predetermined or given device may be a display apparatus reproducing or recording images, sounds, or characters.

The operation enhancing unit 60 may be connected between the memory interface and controller 40 and the main interface unit 50. The operation enhancing unit 60 may include a microprocessor sequentially processing data to be continuously read between the memory interface and controller 40 and the main interface unit 50, and a memory operating at relatively high speed for fast data-transmission, for example, a static random access memory (SRAM) so that data transmitted from the data storage unit 30 may be temporally stored for a given period of time. In addition, the operation enhancing unit 60 may include an error check correction (ECC) circuit to accurately read data. The data storage unit 30 will be described with reference to FIGS. 1-4.

The data storage unit 30 may include a program area 32 and a spare area 34. In the program area 32, predetermined or given data, for example, a movie, music or other various contents may be recorded during manufacturing of the semiconductor memory device M1. Alternatively, the program area 32 may be kept empty as a programmable area so that a user purchasing the semiconductor memory device M1 may record desired data in the program area 32. The spare area 34 may include a spare memory cell for replacing a memory cell having a defect, which may be generated when data is recorded in the program area 32 during manufacturing of the semiconductor memory device M1, from among a plurality of memory cells. The spare area 34 may include a plurality of spare memory cells. The spare memory cells may constitute the same array as that of a plurality of memory cells included in the program area 32. When the program area 32 is kept empty as the programmable area, a memory cell array of the program area 32 may be the same as that of the spare area 34, and the configurations of memory cells of each of the program area 32 and the spare area 34 may be the same. A relative position of the program area 32 with respect to the spare area 34 may be changed, unlike in the case of FIG. 2.

Figure 2:
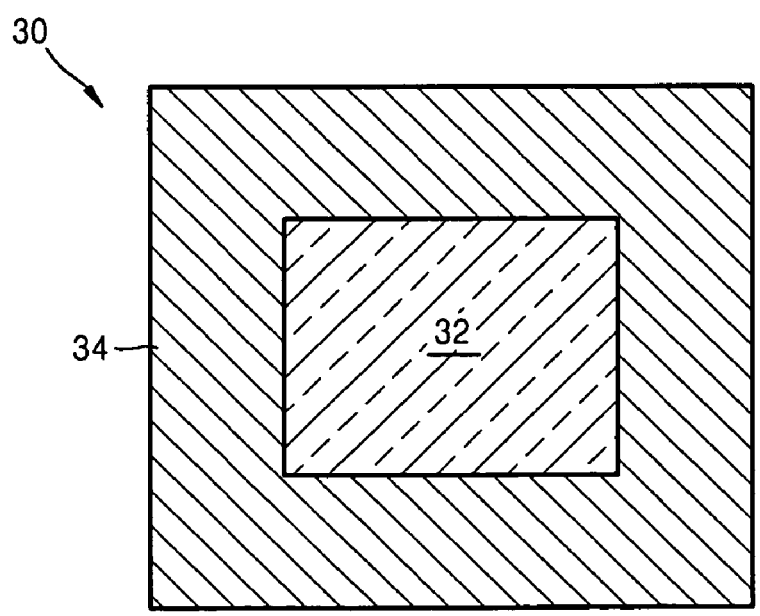
FIG. 2 is a plan view of a data storage unit, according to example embodiments.
Figure 3:
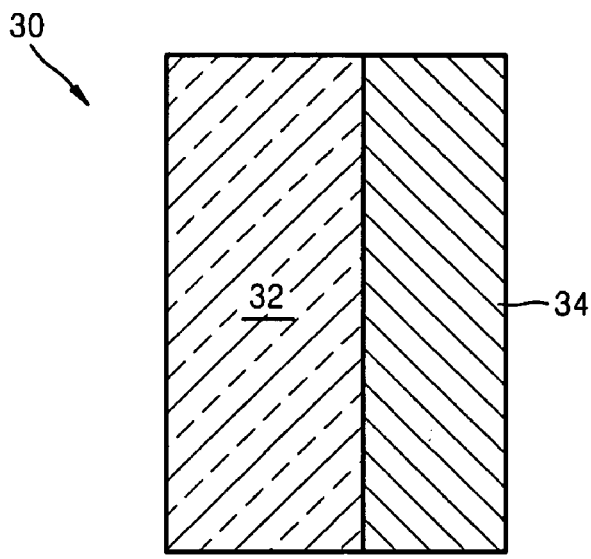
FIG. 3 is a plan view of a data storage unit, according to example embodiments.

For example, the program area 32 may be separately disposed from the spare area 34 rather than being disposed inside the spare area 34 as illustrated in FIG. 2. In this regard, as illustrated in FIG. 3, in the data storage unit 30, the program area 32 may be disposed on the left side of the spare area 34, and the spare area 34 may be disposed on the right side of the program area 32. The positions of the program area 32 and the spare area 34 may be opposite to the case of FIG. 3. In addition, the program area 32 may be disposed above the spare area 34.

Figure 4:
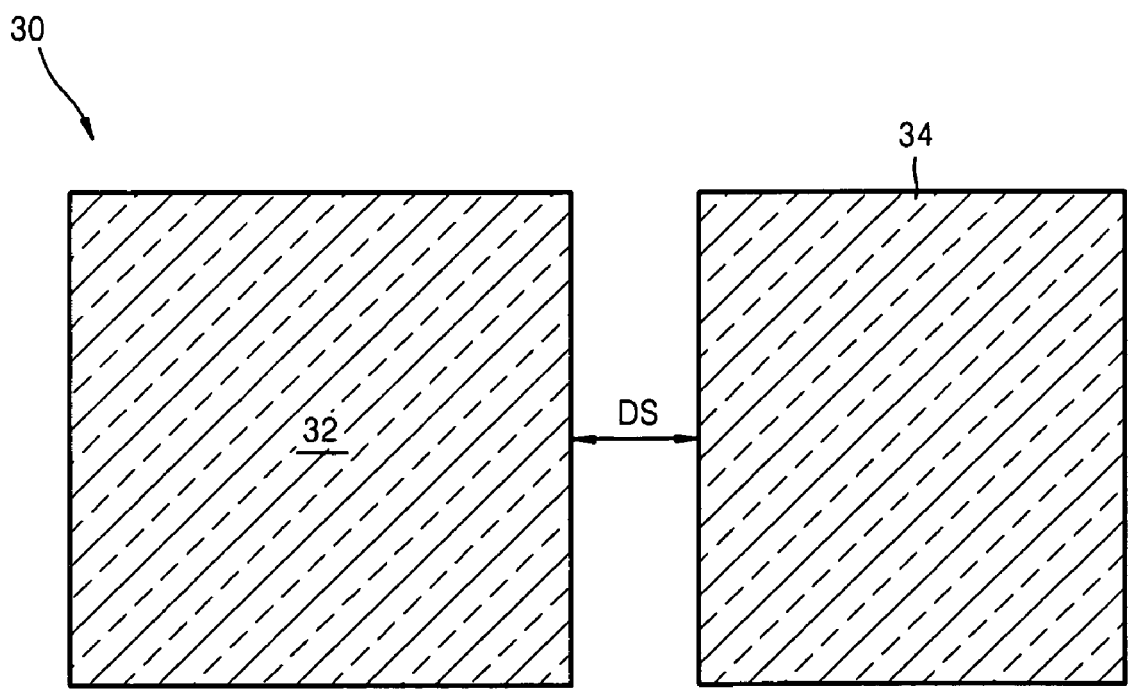
FIG. 4 is a plan view for illustrating the case where a program area and a spare area are spaced apart from each other in the data storage illustrated in FIG. 1.

In example embodiments, the program area 32 may be spaced apart from the spare area by a predetermined or given interval DS, as illustrated in FIG. 4. That is, the program area 32 and the spare area 34 may be disposed on the same substrate plane, or alternatively, may be disposed on different substrate planes. In the semiconductor memory device M1, the data storage unit 30 may be configured as a single-layered memory module including a plurality of memory cells. Alternatively, the data storage unit 30 may be configured as a memory module having at least two layers so as to obtain an increased integration density.

Figure 5:
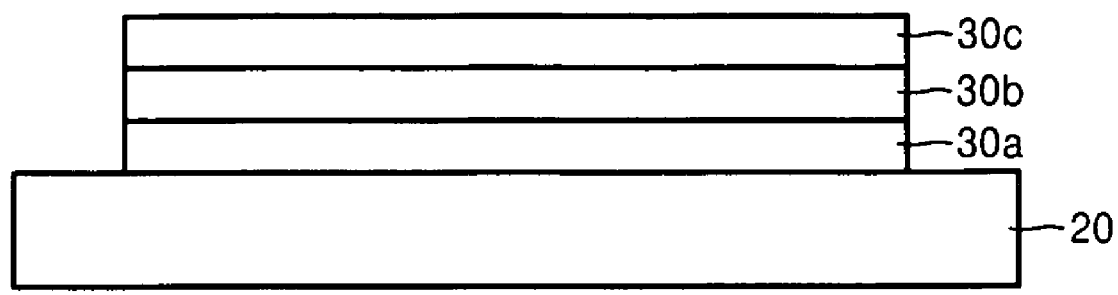
FIG. 5 illustrates a data storage unit configured as a triple-layered memory module, according to example embodiments.

FIG. 5 illustrates a data storage unit configured as a triple-layered memory module, according to example embodiments. Referring to FIG. 5, memory modules 30a, 30b and 30c may be sequentially stacked on a substrate 20. Additional memory modules (not shown) may be stacked on the memory module 30c. The substrate 20 may be a silicon substrate, a glass substrate or a plastic substrate. Each of the memory modules 30a, 30b, and 30c may include the program area 32 and the spare area 34, which are illustrated in FIG. 2, 3 or 4. However, example embodiments are not limited thereto. For example, all of the memory modules 30a, 30b, and 30c may be configured as a program area, and a spare area may be outside the data storage unit 30. In addition, any one of the memory modules 30a, 30b, and 30c may be a spare cell layer including only spare cells, and the other two of the memory modules 30a, 30b and 30c may be each a program cell layer including only programmable memory cells. For example, the memory module 30a may be a spare cell layer and the memory modules 30b and 30c may be each a program cell layer.

In the data storage unit 30, a plurality of memory modules may be integrated so as to constitute a single memory module. For example, in FIG. 5, the memory modules 30a and 30b may be integrated so as to constitute one memory module, and the memory module 30c and a memory module formed thereon may be integrated so as to constitute another memory module. In addition, the memory modules 30a, 30b and 30c may be integrated so as to constitute a single memory module. From this point of view, at least two stacked memory modules may be used as a single memory module.

Figure 6:
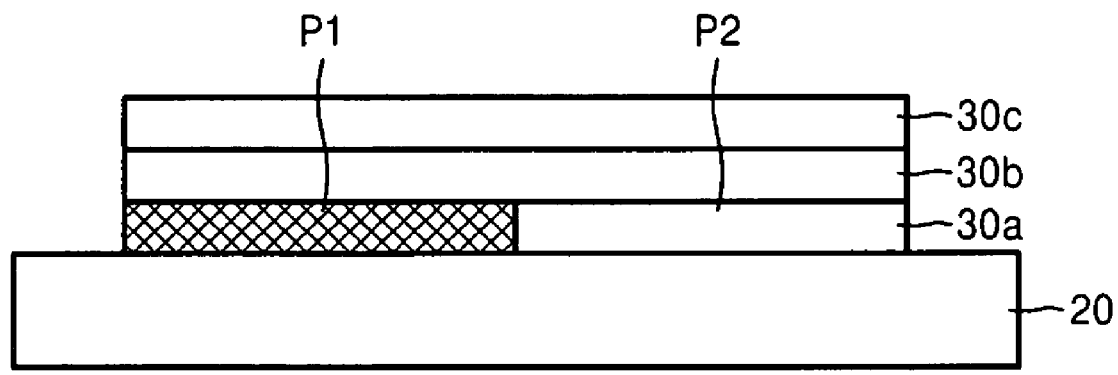
FIG. 6 is a cross-sectional view illustrating the case where the memory module illustrated in FIG. 5 includes two memory modules, according to example embodiments.

As illustrated in FIG. 6, the memory module 30a may include two separate memory modules P1 and P2. Alternatively, the memory module 30a may include at least two memory modules. Also, each of the memory modules 30b and 30c may include at least two memory modules.

Figure 7:
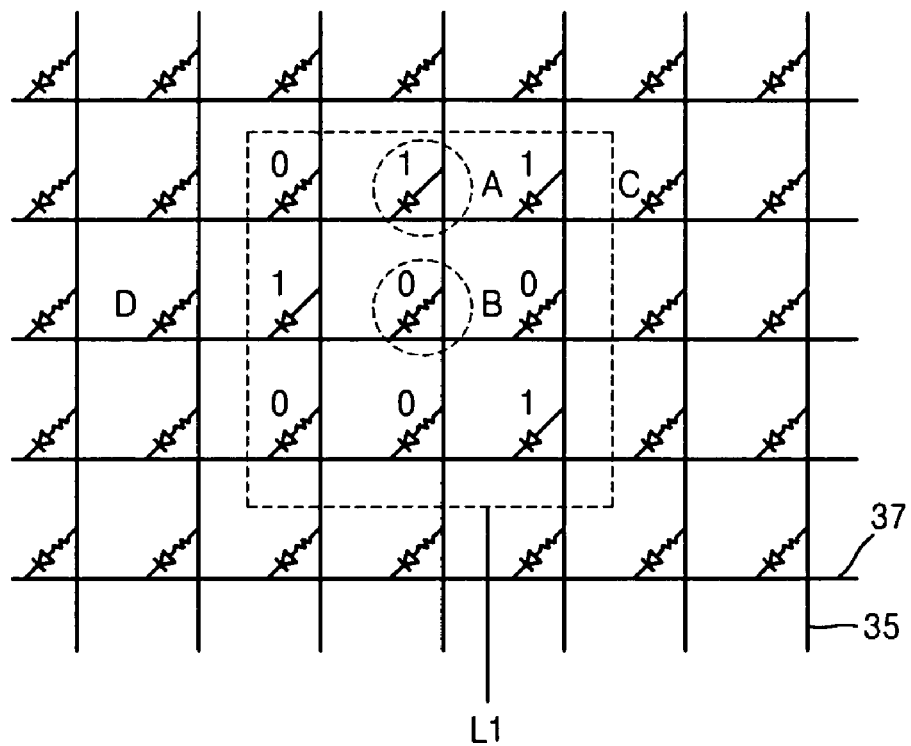
FIG. 7 is a circuit diagram illustrating a cell array of any one of the memory modules illustrated in FIG. 5.

FIG. 7 is a circuit diagram illustrating a cell array of any one of the memory modules 30a, 30b, and 30c illustrated in FIG. 5. In FIG. 7, the inner area marked by a dotted-line block L1 may be a program area and the outer area marked by the dotted-line block L1 may be a spare area. Referring to FIG. 7, cells disposed in the spare area each include a diode and an insulator connected in series between two wirings 35 and 37. On the other hand, memory cells disposed in the program area are differently configured according to data recorded in each of the memory cells. In particular, data 1 may be recorded in a memory cell A of the program area. In this regard, the memory cell A may include a diode connected to the two wirings 35 and 37 between the two wirings 35 and 37. In addition, data 0 may be recorded in a memory cell B of the program area. In this regard, the memory cell B may include a diode and an insulator (resistor) connected in series between the two wirings 35 and 37.

When data cannot be recorded in the memory cells A and B due to a defect generated in the memory cell A and the memory cell B or short circuits occurring between the two wirings 35 and 37 during recording data in the program area, a memory cell C of the spare area may be used instead of the memory cell A and a memory cell D of the spare area may be used instead of the memory cell B.

Alternatively, rather than replacing a memory cell by another memory cell, memory cells in a row may be replaced by memory cells in another row, or memory cells in a column may be replaced by memory cells in another column. For example, memory cells in a predetermined or given column of the spare area may be used instead of memory cells in an entire column to which the first and second memory cells A and B belong.

As described above, when a memory cell, memory cells in a row and memory cells in a column of the program area are replaced by another memory cell, memory cells in another row and memory cells in another column, respectively, a cell of the spare area may be variously used according to data recorded in a memory cell of the program area. For example, data 1 may be recorded in the memory cell A, and the memory cell A may include only a diode having both ends connected to the two wirings 35 and 37 and between the two wirings 35 and 37.

However, the memory cell C of the spare area, which is to be used instead of the memory cell A, may include an insulator between the wiring 35 and a diode. Thus, in order to use the memory cell C of the spare area instead of the memory cell A of the program area, a predetermined or given breakdown voltage may be applied to the memory cell C of the spare area. Due to the breakdown voltage, insulation of the insulator disposed between the diode of the memory cell C of the spare area and the wiring 35 may be broken. As a result, the memory cell C of the spare area may be in a state in which data 1 is recorded as in the memory cell A of the program area. Data 0 may be recorded in the second memory cell B of the program area. In this regard, data 0 refers to a state in which a current does not flow between a diode and the wiring 35 due to an insulator disposed therebetween. Because an insulator is disposed between a diode and a wiring in all cells of the spare area, the memory cell B may be in a state in which a current does not flow. Thus, the memory cell D of the spare area may be used instead of the memory cell B of the program area. Applying the break voltage may not be necessary.

Figure 8:
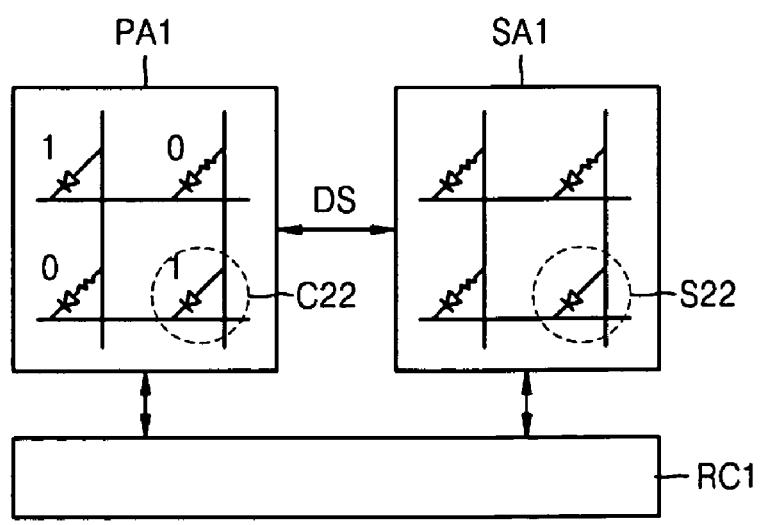
FIG. 8 is a circuit diagram illustrating a cell array of any one of the memory modules illustrated in FIG. 5.

FIG. 8 is a circuit diagram illustrating a cell array of any one of the memory modules 30*a*, 30*b* and 30*c* illustrated in FIG. 5. For convenience of description, a cell array of the first memory module 30*a* is assumed to be illustrated in FIG. 8.

Referring to FIG. 8, the first memory module 30*a* may include a program area PA1 and a spare area SP1. The program area PA1 and the spare area SP1 may be spaced apart from each other by the predetermined or given interval DS. Each of the program area PA1 and the spare area SP1 may include cells arranged in two rows and two columns, or alternatively may include cells arranged in more than two rows and two columns. A defective cell may be replaced in the circuit of FIG. 8 as follows.

When a memory cell of the program area PA1, for example, a memory cell C22 provided in an area where the second row and the second column intersect and in which data 1 is recorded, is a defective cell, a repairing circuit RC1 may determine that the memory cell C22 is a defective cell and may select a spare cell S22 in a spare area SA1 to replace the memory cell C22. The spare cell S22 may be disposed in the same row and the same column as the memory cell C22, or alternatively, may be disposed in a different row and column. When the spare cell S22 replacing the memory cell C22 is selected, a voltage may be applied to the spare cell S22 so as to record data 1, which is the same data as a data recorded in the memory cell S22. The repairing circuit RC1 may be disposed in the first memory module 30*a*.

Figure 9:
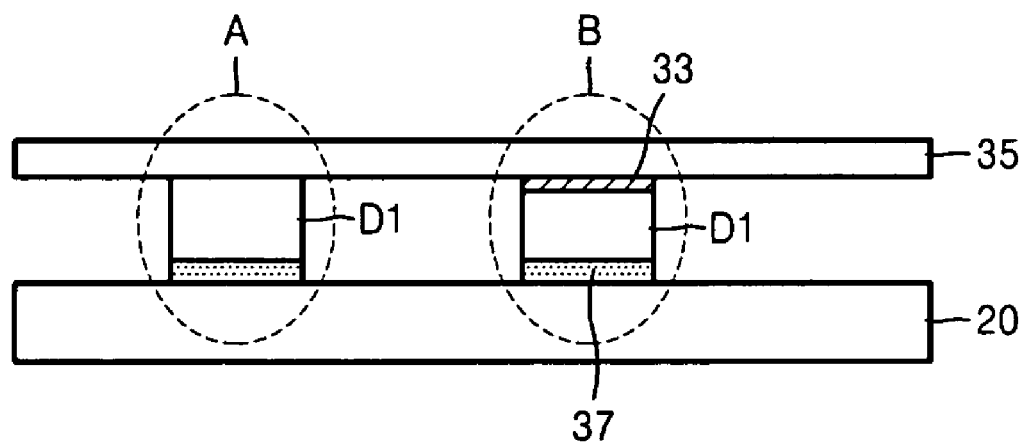
FIG. 9 is a cross-sectional view of memory cells illustrated in FIG. 7.

FIG. 9 is a cross-sectional view of the memory cells A and B illustrated in FIG. 7, which is viewed from the left side of FIG. 7. Referring to FIG. 9, the memory cell A in which data 1 is recorded may include a first wiring 37, a diode D1 and a second wiring 35, which are sequentially stacked on the substrate 20. The diode D1 may be disposed at an intersection between the first and second wirings 37 and 35. The memory cell B in which data 0 is recorded may include the first wiring 37, the diode D1, an insulating layer 33 and the second wiring 35, which are sequentially stacked on the substrate 20.

All memory cells of the spare area of FIG. 7 may each have the same configuration as the second memory cell B illustrated in FIG. 9. Thus, as described with reference to FIG. 7, in order to use a memory cell of the spare area instead of the first memory cell A, insulation of the insulating layer 33 disposed between the second wiring 35 and the diode D1 may need to be broken by applying a predetermined or given breakdown voltage between the first and second wirings 35 and 37.

Figure 10:
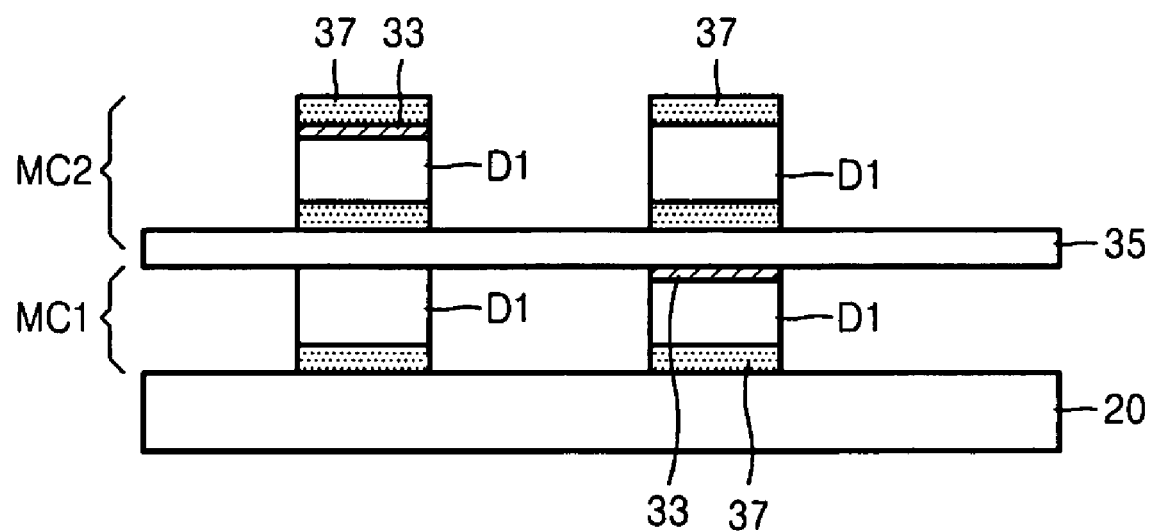
FIG. 10 is a cross-sectional view illustrating where a memory cell layer including a plurality of memory cells is on a second wiring illustrated in FIG. 9.

As illustrated in FIG. 10, a memory cell layer MC2 including a plurality of memory cells may be disposed on the second wiring 35 illustrated in FIG. 9. When a memory cell layer (hereinafter, referred to as a memory cell layer MC1) including the memory cells A and B illustrated in FIG. 9 corresponds to any one of the memory modules 30*a*, 30*b* and 30*c* illustrated in FIG. 5, for example, to the memory module 30*a*, a memory cell layer MC2 illustrated in FIG. 10 may correspond to the memory module 30*b* illustrated in FIG. 5. In FIG. 10, the second wiring 35 may be a common wiring of the memory cell layers MC1 and MC2.

Figure 11:
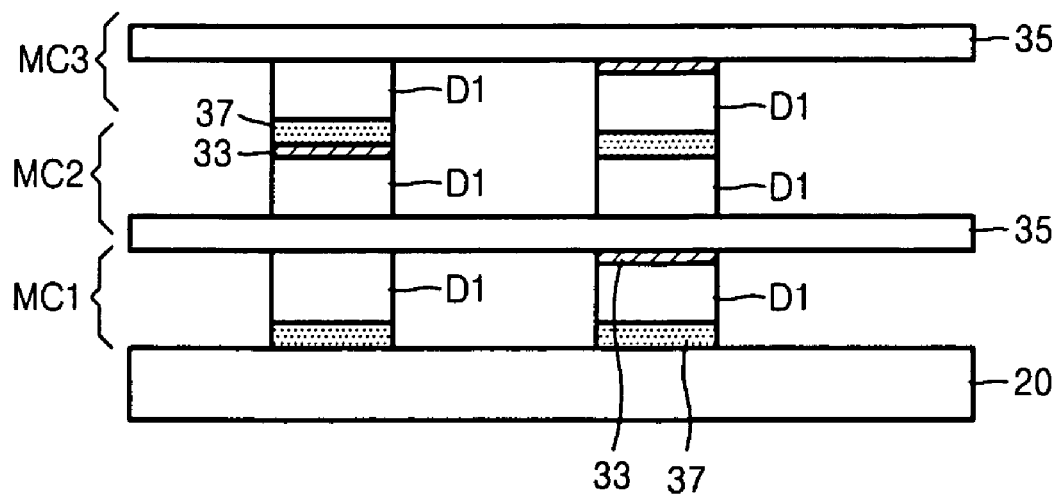
FIG. 11 is a cross-sectional view illustrating where a third memory cell layer is on a second memory cell layer illustrated in FIG. 10.

As illustrated in FIG. 11, a memory cell layer MC3 may be disposed on the memory cell layer MC2 illustrated in FIG. 10. The memory cell layer MC3 may correspond to the memory module 30*c* illustrated in FIG. 5. In FIG. 11, the first wiring 37 may be a common wiring of the memory cell layers MC2 and MC3. As illustrated in FIG. 11, where the memory cells MC1, MC2 and MC3 are sequentially stacked, when any one of the memory cell layers MC1, MC2 and MC3, for example, the memory cell layer MC3 is a memory cell layer including only a spare cell, all memory cells included in the third memory cell layer MC3 may each include the insulating layer 33 between the second wiring 35 and the diode D1, as illustrated in FIG. 12.

Figure 12:
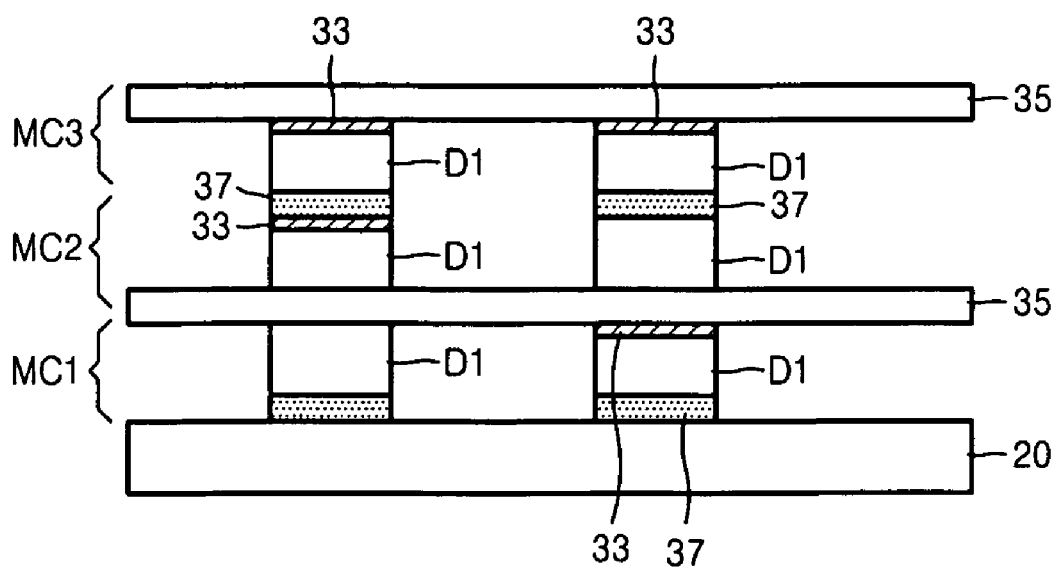
FIG. 12 is a cross-sectional view illustrating the case where all memory cells included in the third memory cell layer include an insulating layer between an upper wiring and a diode.
Figure 13:
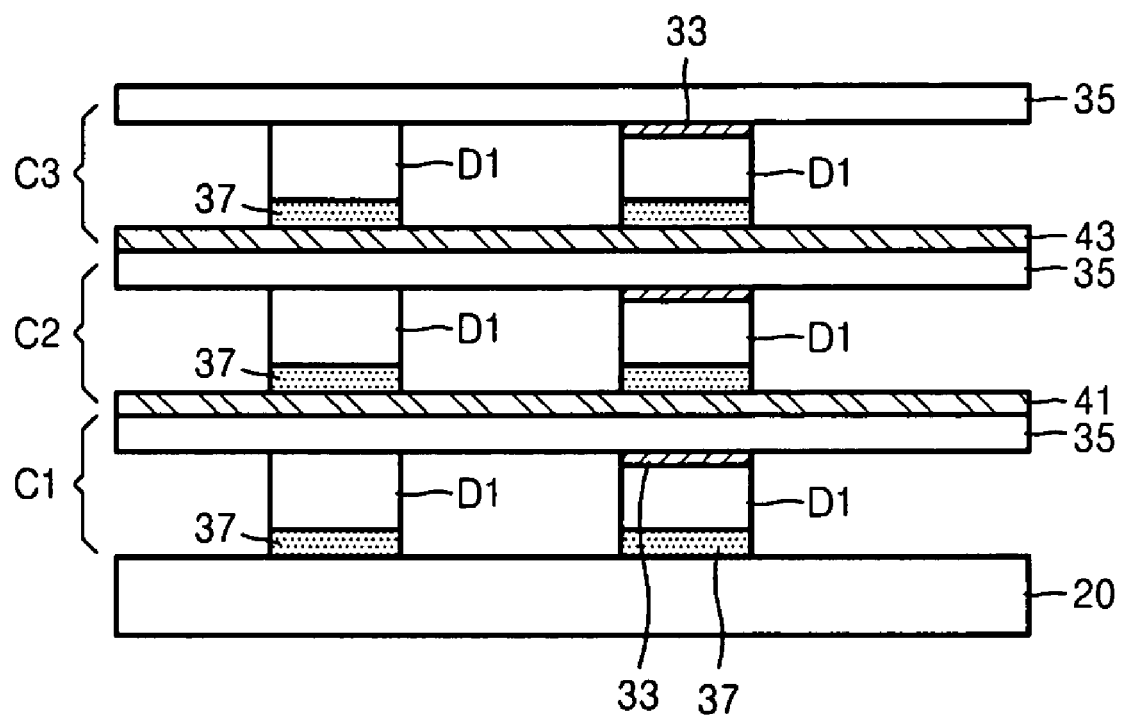
FIG. 13 illustrates the case where the memory cells illustrated in FIGS. 10 through 13 are independently formed, according to example embodiments.

In FIGS. 10 through 12, the memory cell layers MC1, MC2, and MC3 may be independently formed. FIG. 13 illustrates where memory cells C1, C2, and C3 are independently formed, according to example embodiments. Referring to FIG. 13, the memory cells C1, C2 and C3 may be sequentially stacked on the substrate 20. A first interlayer insulating layer 41 may be disposed on the memory cell layer C1. The memory cell layer C2 may be disposed on the first interlayer insulating layer 41. A second interlayer insulating layer 43 may be disposed on the memory cell layer C2. The memory cell layer C3 may be disposed on the second interlayer insulating layer 43. The first and second interlayer insulating layers 41 and 43 may each be a silicon oxide layer or a nitride layer. The memory cells C1, C2, and C3 may correspond to the memory modules 30*a*, 30*b*, and 30*c* illustrated in FIG. 5, respectively.

In FIG. 13, the memory cells C1, C2 and C3 may each include a program area and a spare area, which have the same configuration as in FIG. 8 or 7. Alternatively, an entire portion of any one layer (e.g., the memory cell layer C3) of the memory cell layers C1, C2 and C3 may be a spare area including only a spare cell, and an entire portion of the other two layers of the memory cell layers C1, C2 and C3 may be a program area.

The diode D1 described with reference to FIGS. 7 through 13 may be a junction diode in which a p-type oxide semiconductor and an n-type oxide semiconductor are bonded. The p-type oxide semiconductor may be formed of CuO, or alternatively, may be formed of NiO or YBaCuO. The n-type oxide semiconductor may be formed of InZnO, or alternatively, may be formed of InO or SnO. When CuO and InZnO are used for forming the diode D1, the diode D1 may be formed using a sputtering apparatus at room temperature.

Figure 14:
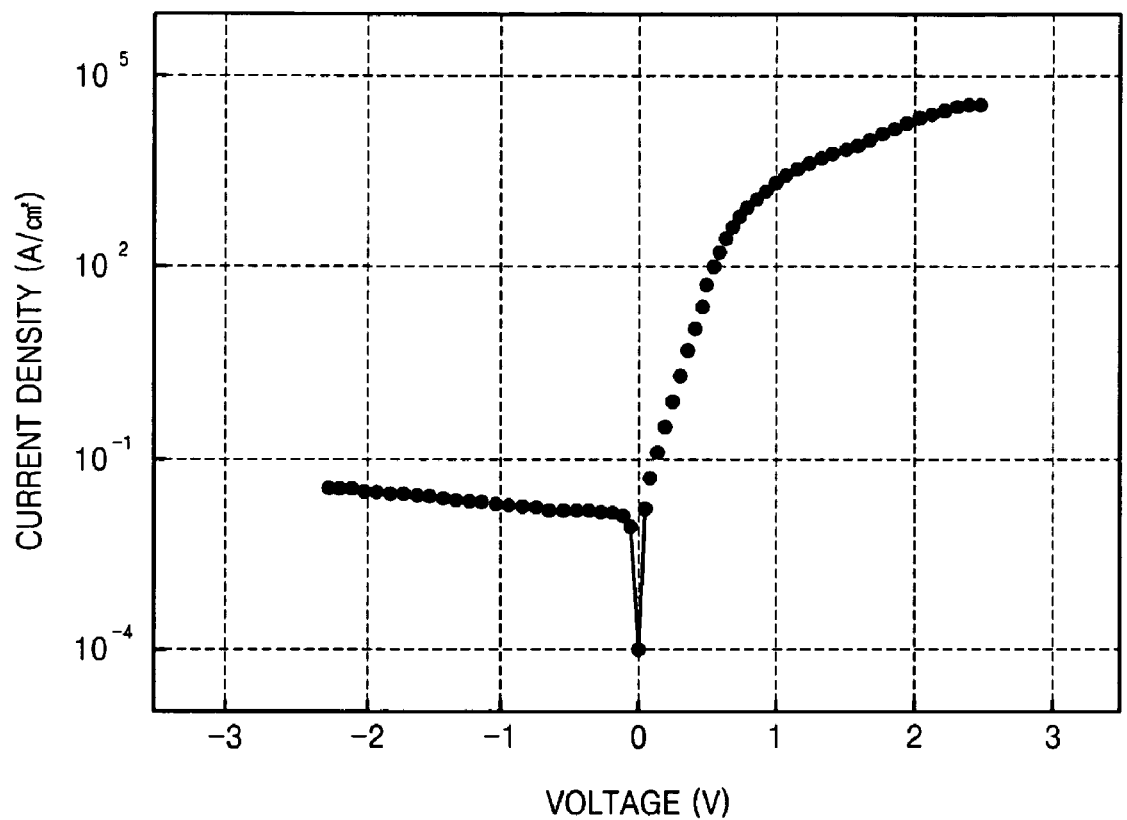
FIG. 14 illustrates the current-voltage characteristics of a junction diode including a p-type oxide semiconductor formed of CuO and an n-type oxide semiconductor formed of InZnO, according to example embodiments.

FIG. 14 illustrates the current-voltage characteristics of a junction diode including a p-type oxide semiconductor formed of CuO and an n-type oxide semiconductor formed of InZnO, according to example embodiments. Referring to FIG. 14, the current ratio between a positive-direction current and a negative-direction current may be equal to or greater than about 10,000.

When the p-type oxide semiconductor and the n-type oxide semiconductor are used, the diode D1 may be formed at a temperature equal to or less than about 400° C. In addition, other elements of the memory cell layers C1, C2 and C3, for example, the wirings 35 and 37, and the insulating layer 33 may be formed at a temperature much less than about 400° C., and etching may also be performed at a temperature less than about 400° C. Thus, when the diode D1 includes the p-type oxide semiconductor and the n-type oxide semiconductor, the substrate 20 may be a glass substrate as well as a silicon substrate.

The glass substrate may be a large-sized glass substrate used for manufacturing a display apparatus. Thus, when the diode D1 includes the p-type oxide semiconductor and the n-type oxide semiconductor, the number of memory chips obtained from a single substrate may be increased compared to a high temperature process in which a glass substrate cannot be used.

Accordingly, the manufacturing costs of the memory chip may be reduced. The memory chip may correspond to the semiconductor memory device M1 illustrated in FIG. 1. The memory chip may include only the data storage unit 30 from among various elements of the semiconductor memory device M1. That is, elements included in the semiconductor memory device M1 except for the data storage unit 30 may be separately formed from the data storage unit 30 rather than being formed on a substrate on which the data storage unit 30 is formed, and then may be electrically connected to the data storage unit 30.

Instead of the diode D1 including the p-type oxide semiconductor and the n-type oxide semiconductor, when a poly silicon pn diode or an amorphous silicon diode, which is formed at low temperature, is used, the same effect as an effect by example embodiments may be obtained. Alternatively, the diode D1 may be a Schottky diode or a back-to-back diode.

Figure 15:
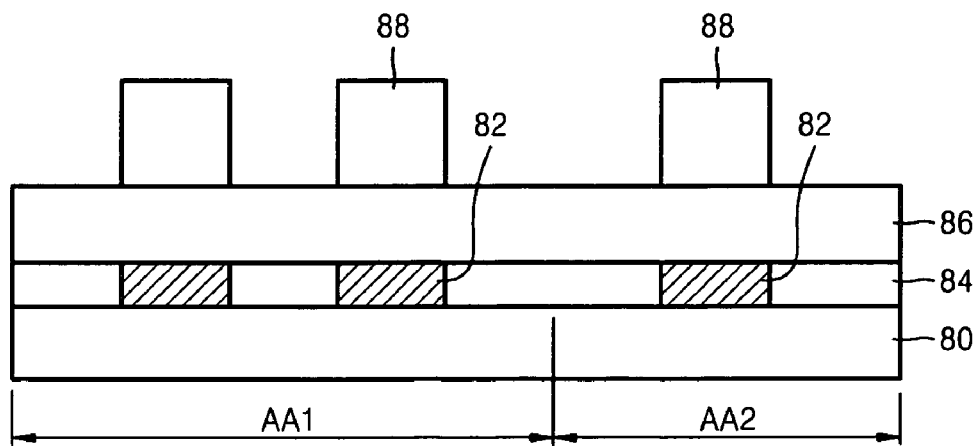
FIGS. 15 and 17-31 illustrate a method of manufacturing a memory module in a method of manufacturing a memory device, according to example embodiments.
Figure 16:
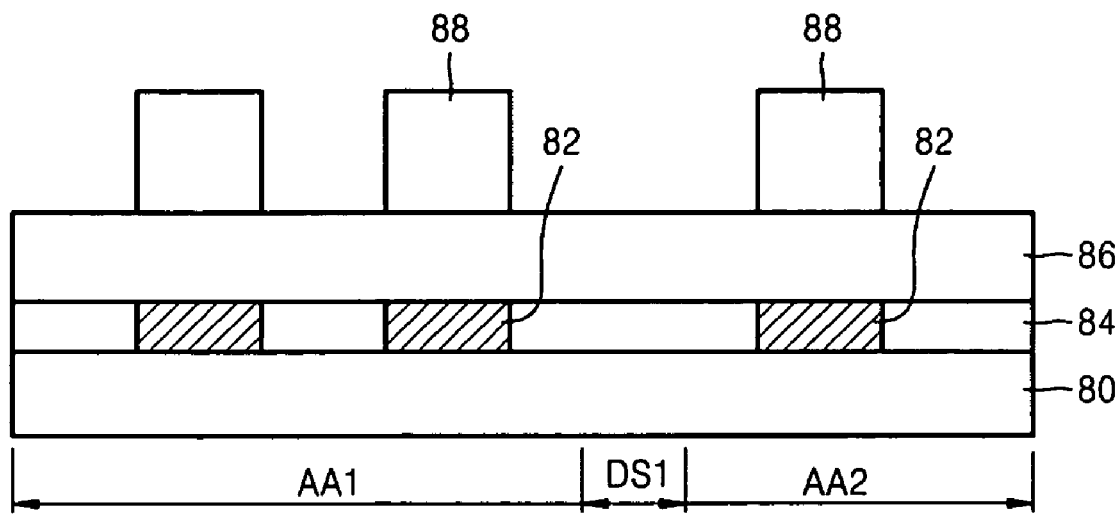
FIG. 16 is a cross-sectional view illustrating a program area and a spare area in a method of manufacturing a memory device.

A method of manufacturing a memory device according to example embodiments will now be described. Referring to FIG. 15, a substrate 80 may be divided into a first area AA1 and a second area AA2. The first area AA1 may be an area in which a memory cell to be programmed is to be formed. The second area AA2 may be an area in which a spare cell replacing the memory cell if necessary is to be formed. The first and second areas AA1 and AA2 may be spaced apart from each other by a given interval DS1, as illustrated in FIG. 16. The substrate 80 may be a silicon substrate, a glass substrate or a plastic substrate. A plurality of first conductive patterns 82 may be formed on the first and second area AA1 and AA2 of the substrate 80. The first conductive patterns 82 may correspond to the first wiring 37 or the second wiring 35 illustrated in FIGS. 7 and 9 through 13.

The first conductive patterns 82 may be formed by forming a conductive layer (not shown) on the substrate 80 and then patterning the conductive layer as a plurality of lines which are parallel to each other and spaced apart from each other at a predetermined or given interval. In example embodiments, the conductive layer may be a conductive material layer that is used for a wiring of a semiconductor device, and may be a copper layer, an aluminum layer or a metal silicide layer. After the first conductive patterns 82 is formed, a interlayer insulating layer 84 may be formed on the substrate 80 so as to fill a space between the first conductive patterns 82. The interlayer insulating layer 84 may be formed of an interlayer insulating material that is generally used in a method of manufacturing a semiconductor device.

A diode layer 86 covering the first conductive patterns 82 may be formed on the interlayer insulating layer 84. The diode layer 86 may be formed by sequentially stacking a p-type oxide semiconductor and an n-type oxide semiconductor. This stacking order of the p-type oxide semiconductor and the n-type oxide semiconductor may be changed. The p-type oxide semiconductor may be formed of CuO for example. The n-type oxide semiconductor may be formed of InZnO for example. Alternatively, other various materials may be used for forming the p-type and n-type oxide semiconductors. The diode layer 86 may be a poly silicon pn diode layer or an amorphous silicon pn diode layer that is formed at a low temperature, for example, at a temperature less than about 400° C.

When the diode layer 86 includes the p-type oxide semiconductor and the n-type oxide semiconductor, or when the diode layer 86 includes the poly silicon pn diode layer or an amorphous silicon pn diode layer, the substrate 80 may be a glass substrate. Of course, in example embodiments, a silicon substrate may be used as the substrate 80. However, when the glass substrate is used as the substrate 80, because the number of memory chips may be increased compared to the case of the silicon substrate, the manufacturing costs of the memory device may be reduced.

A mask pattern 88 may be formed on the diode layer 86. The mask pattern 88 may be a photosensitive film pattern or another kind of mask pattern. The mask pattern 88 may define a region of the first conductive pattern 82, on which a diode is to be formed. The diode layer 86 may be etched using the mask pattern 88 as an etching mask until the interlayer insulating layer 84 is exposed. The mask pattern 88 may be removed.

Figure 17:
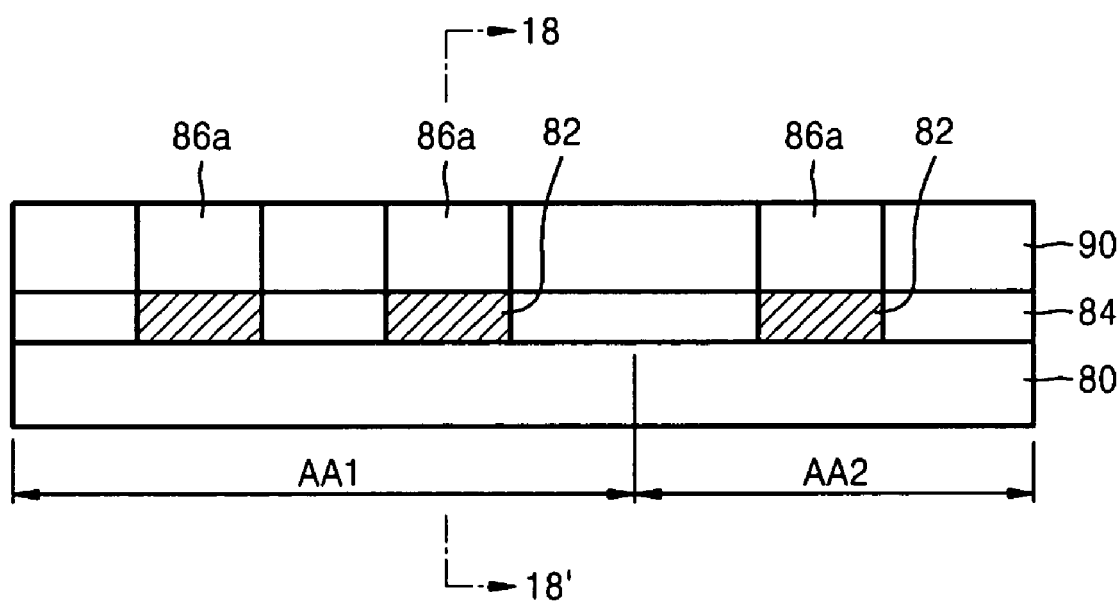

FIG. 17 illustrates the result after the etching described with reference to FIG. 16. Referring to FIG. 17, by the etching, a plurality of diodes 86a may be formed on the first conductive patterns 82, respectively. The diodes 86a may be a pn diode, a Schottky diode or a back to back diode. After the diodes 86a are formed, a second interlayer insulating layer 90 may be formed on the interlayer insulating layer 84 so as to surround the diodes 86a, thereby filling spaces between the diodes 86a. This result may be obtained by forming the second interlayer insulating layer 90 covering the diodes 86a and then planarizing an upper surface of the second interlayer insulating layer 90 until the diodes 86a are exposed.

Figure 18:
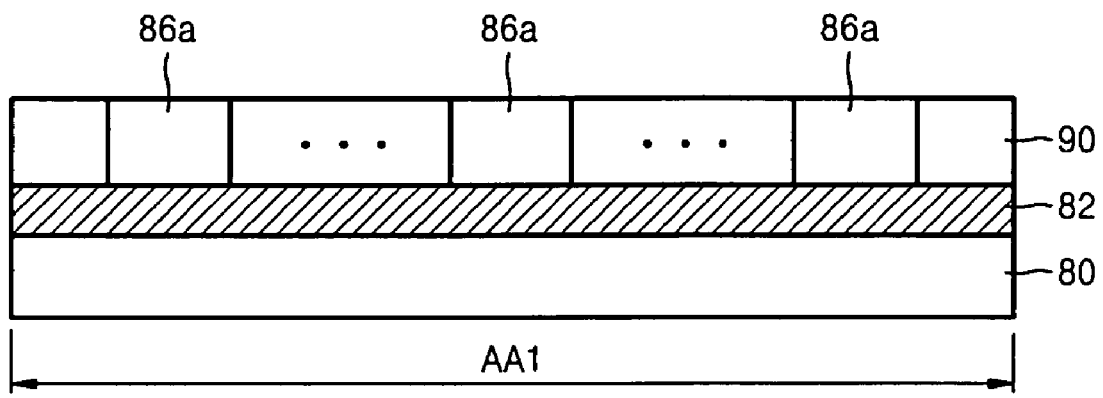
Figure 19:
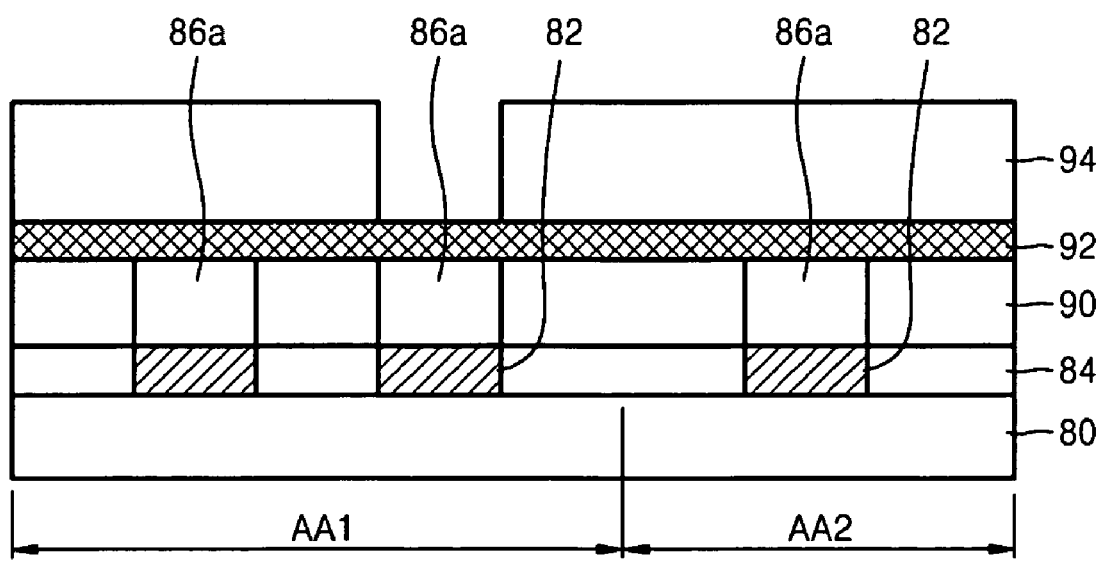

FIG. 18 is a cross-sectional view of a structure taken along a line 18-18' of FIG. 17. Referring to FIG. 19, an insulating layer 92 covering the diodes 86a may be formed on the second interlayer insulating layer 90. The insulating layer 92 may correspond to the insulating layer 33 (see FIG. 12) of a memory cell included in a program area and a spare cell included in a spare area. Thus, a portion of the insulating layer 92 may be removed, wherein the portion is formed on a diode that is selected from among the diodes 86a formed on the first area AA1 and is included in a memory cell in which data 1 is to be recorded. The selected diode may be at least one of the diodes 86a, which is disposed on the first area AA1, for example, the second diode 86a from the left in FIG. 19.

A mask pattern 94 may be formed on the insulating layer 92. The mask pattern 94 may be formed so as to expose a portion of the insulating layer 92, which is formed on one among the diodes 86a. For convenience of description, the number of diodes 86a formed in the first area AA1 may be two. However, two or more diodes may be formed in the first area AA1. Thus, the number of diodes included in a memory cell in which data 1 is to be recorded may be highly increased according to data recorded in the first area AA1. Although not illustrated, the number of portions of the insulating layer 92, which are exposed through the mask pattern 94, may be highly increased. The exposed portion of the insulating layer 92 may be etched using the mask pattern 94 as an etching mask until the diodes 86a are exposed. The mask pattern 94 may be removed.

Figure 20:
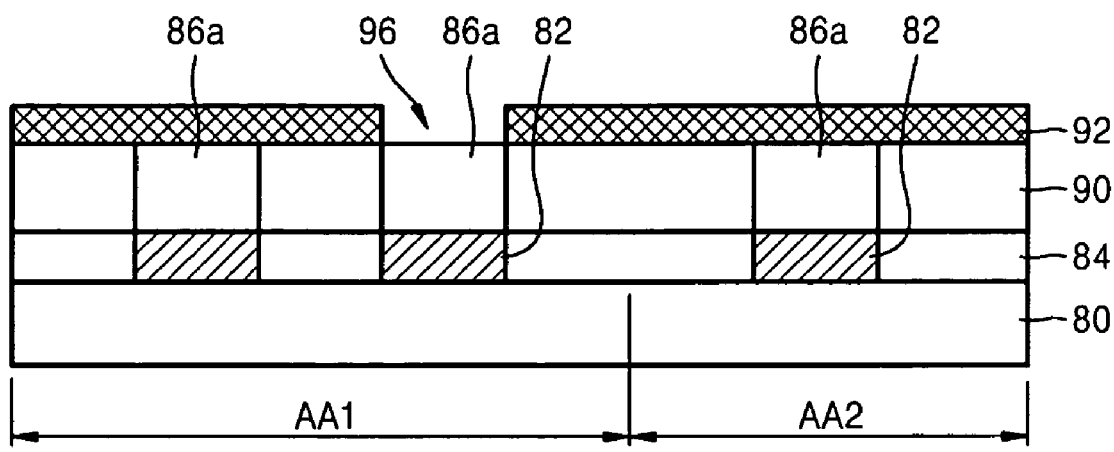
Figure 21:
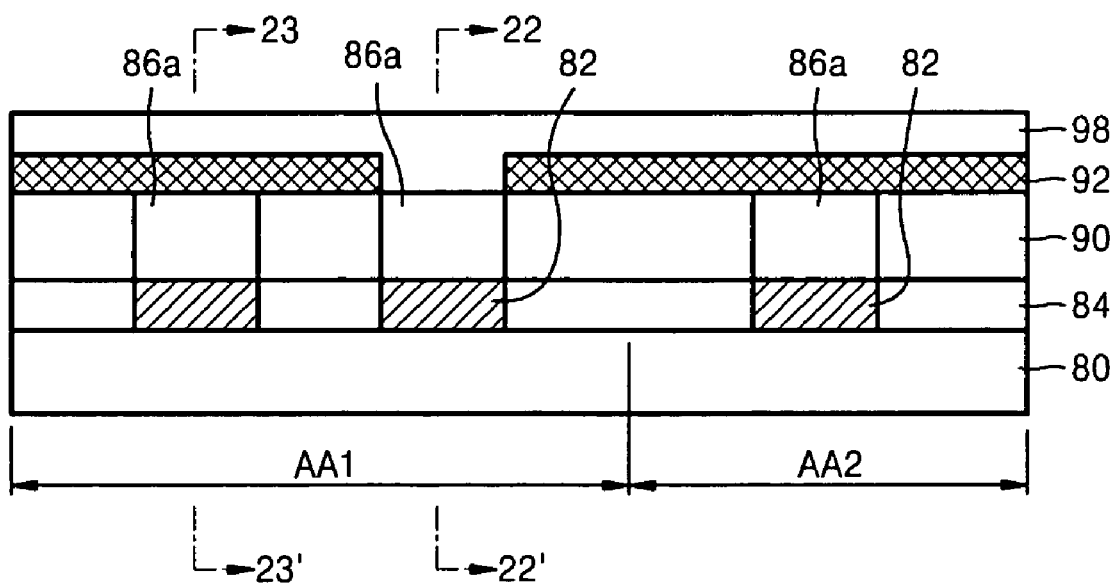

FIG. 20 illustrates the result of removing the mask pattern 94. Referring to FIG. 20, a via hole 96 may be formed in the insulating layer 92 so as to expose the selected diode 86a. Referring to FIG. 21, a second conductive pattern 98 may be formed on the insulating layer 92 so as to fill the via hole 96 and contact the exposed diode 86a. The second conductive pattern 98 may be formed of the same material as the first conductive pattern 82, or the second conductive pattern 98 may be formed of a different material from the first conductive pattern 82. The second conductive pattern 98 may be formed so as to cross the first conductive pattern 82. For example, the second conductive pattern 98 may cross perpendicular to the first conductive pattern 82. The second conductive pattern 98 may be formed using the method of forming the first conductive pattern 82. The second conductive pattern 98 may correspond to the second wiring 35.

Figure 22:
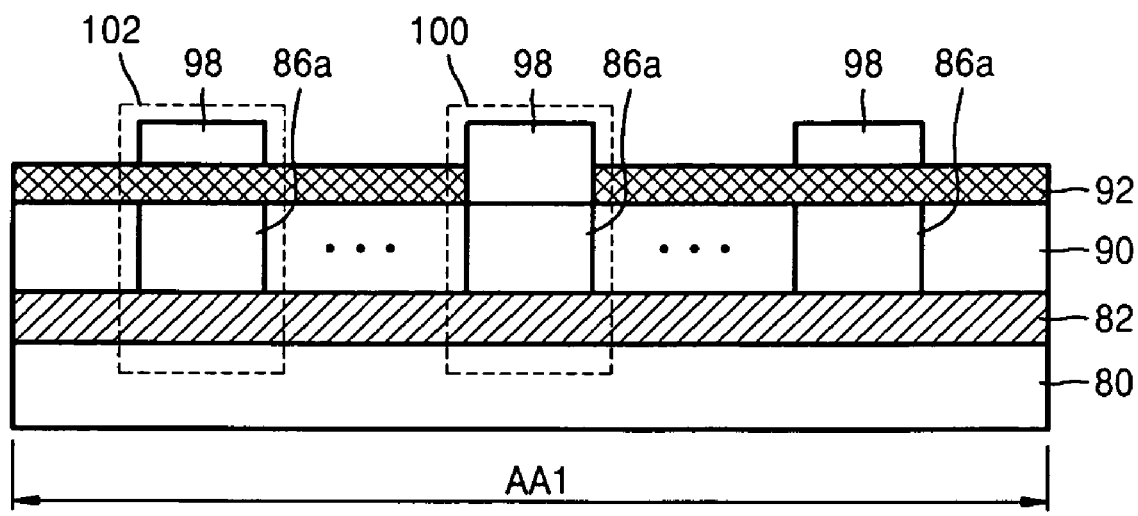
Figure 23:
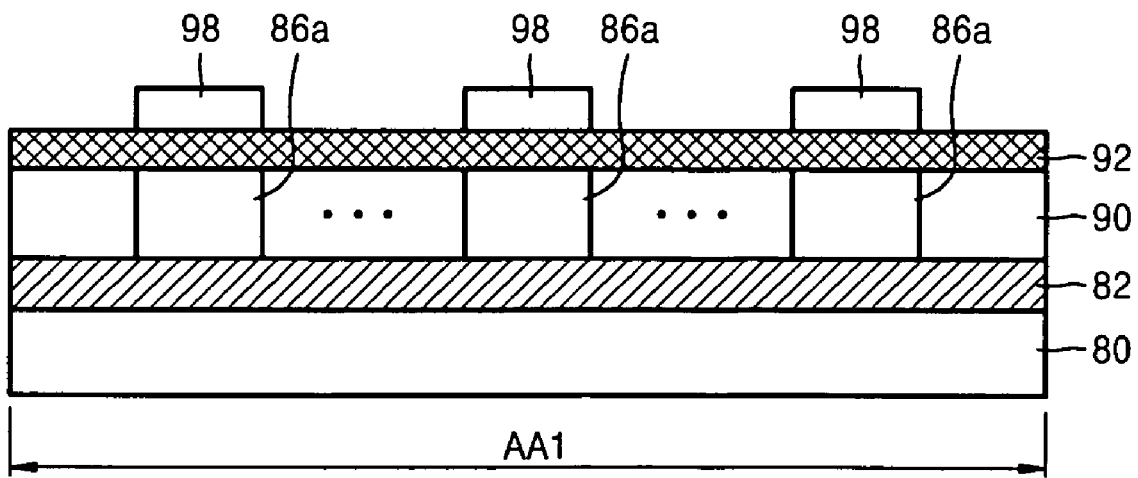

FIG. 22 is a cross-sectional view of a structure taken along a line 22-22' of FIG. 21. FIG. 23 is a cross-sectional view of a structure taken along a line 23-23' of FIG. 21. In FIG. 22, a first dotted-line box 100 indicates a memory cell in which data 1 is recorded, and a second dotted-line box 102 indicates a memory cell in which data 0 is recorded. A configuration of a memory cell of the first area AA1, in which data 0 is recorded, may be the same as a configuration of a spare cell of the second area AA2.

Figure 24:
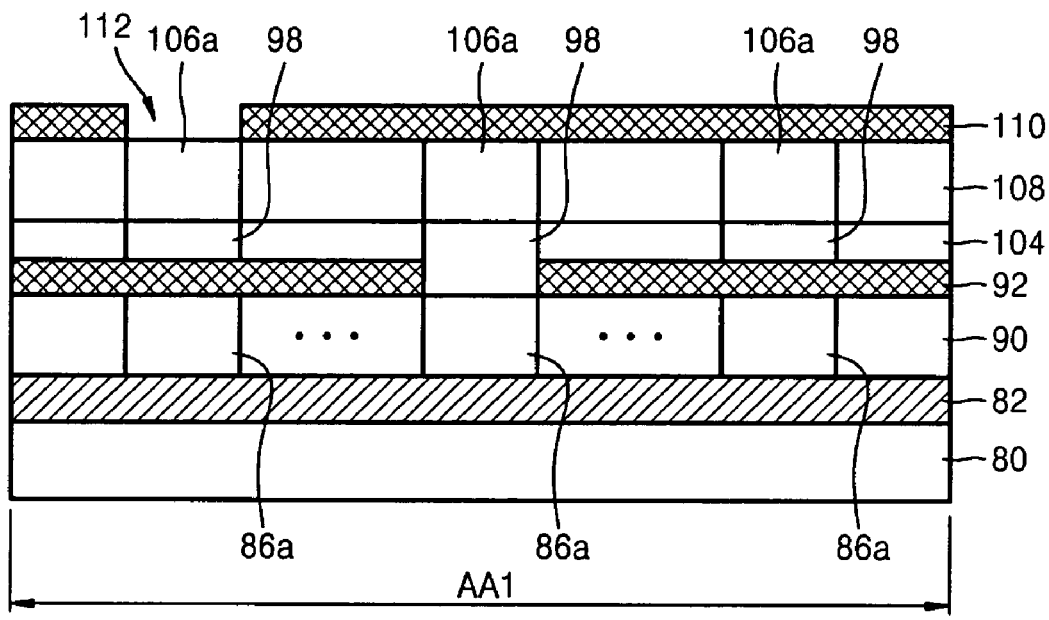

Referring to FIG. 24, in the structure shown in FIG. 11, a third insulating layer 104 may fill spaces between the second conductive patterns 98. A plurality of second diodes 106a may be formed on the second conductive patterns 98, respectively. The second diodes 106a may be formed using the method for forming the diode 86a. The second diode 106a may be the same as or different from the diode 86a. In FIG. 24, only the first area AA1 is illustrated, but the second diode 106a may also be formed on the second area AA2. Elements to be later described may also be formed on the second area AA2. After the second diodes 106a are formed, a fourth interlayer insulating layer 108 may fill spaces between the second diodes 106a. A second insulating layer 110 covering the second diodes 106a may be formed on the fourth interlayer insulating layer 108. The material or function of the second interlayer insulating layer 110 may be the same as those of the insulating layer 92. A via hole 112 may be formed in the second interlayer insulating layer 110. A selective second diode 106a may be exposed through the via hole 112. The selective second diode 106a may be one of the second diodes 106a. The second diode 106a that is exposed through the via hole 112 and selected from the second diodes 106a may be illustrated as the leftmost one.

However, all of the second diodes 106a that are formed in the first area AA1 and are included in a memory cell in which data 1 is to be recorded may be the selected second diode 106a exposed through the via hole 112. Thus, a plurality of via holes may be formed in the second interlayer insulating layer 110 and the same number of second diodes as the number of the plurality of via holes may be exposed through the plurality of via holes. A diode to be exposed from among the second diodes 106a may be determined according to data to be recorded, e.g., an image, a sound, or a character. Forming the via holes 96 and 112 in the insulating layer 92 and the second interlayer insulating layer 110 may record data.

Figure 25:
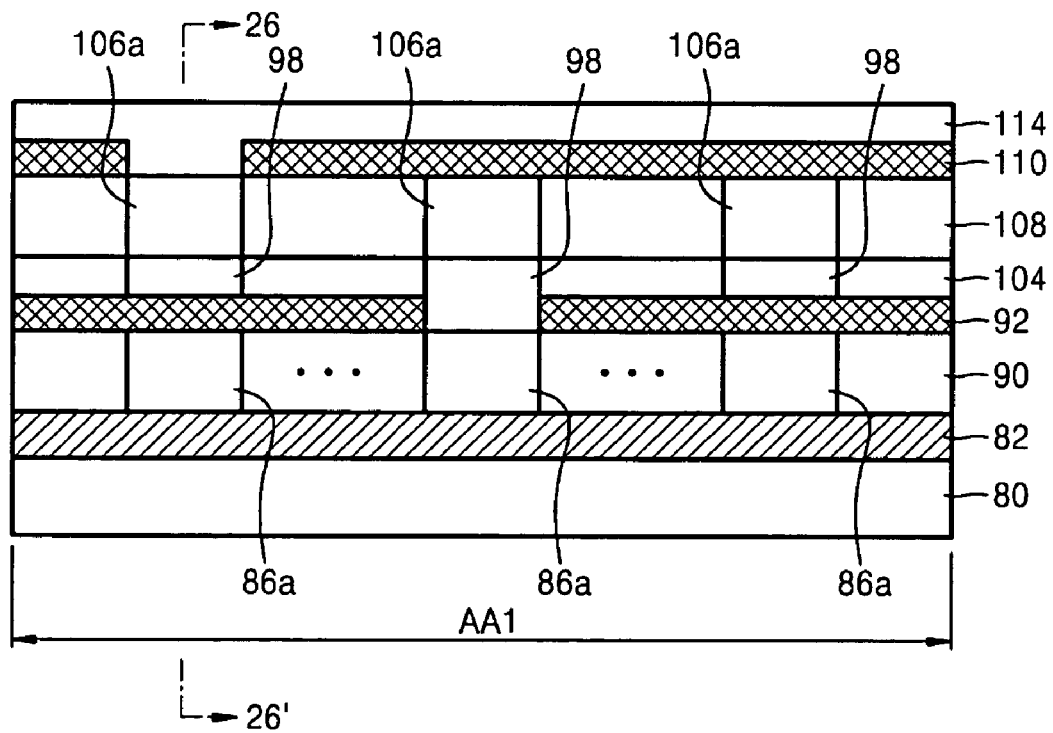
Figure 26:
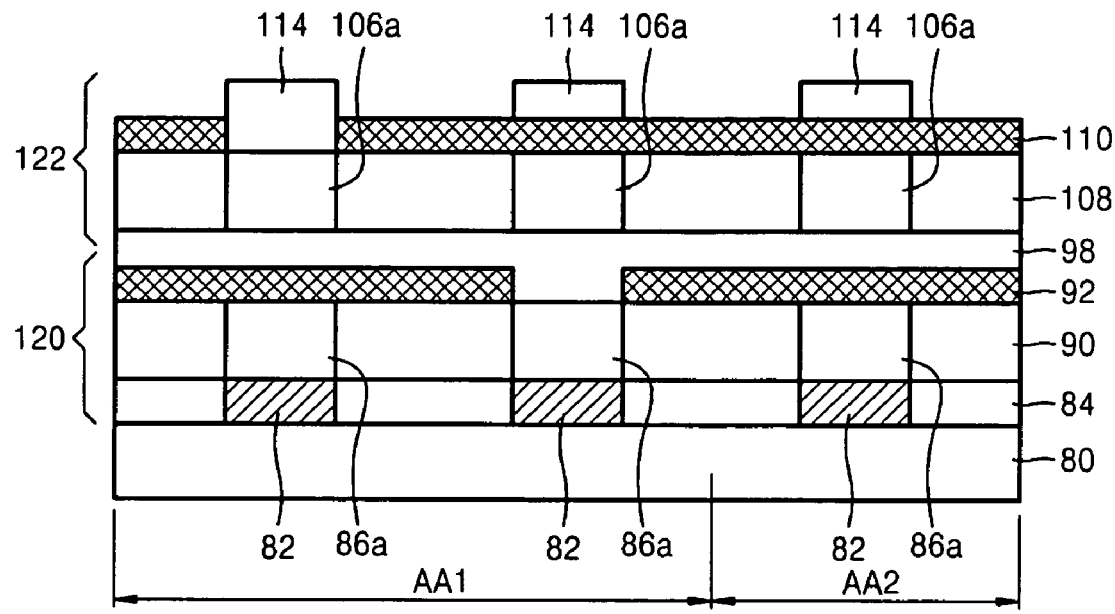

As illustrated in FIG. 25, a third conductive pattern 114 filling the via hole 112 may be formed on the second interlayer insulating layer 110. The third conductive pattern 114 may be formed in parallel to the first conductive pattern 82 so as to cross the second conductive pattern 98, for example, at a right angle. The third conductive pattern 114 may be formed so as to have the same configuration as that of the first conductive pattern 82. FIG. 26 is a cross-sectional view of a structure taken along a line 26-26' of FIG. 25. In FIG. 26, the second diode 106a, the second interlayer insulating layer 110 and the third conductive pattern 114, which are formed in the second area AA2, are illustrated.

In FIG. 26, the first conductive pattern 82, the diodes 86a, the insulating layer 92 and the second conductive pattern 98 may form a first memory cell layer 120 including a plurality memory cells and a plurality of spare cells. In addition, the second conductive pattern 98, the second diode 106a, the second interlayer insulating layer 110 and the third conductive pattern 114 may form a second memory cell layer 122 including a plurality of memory cells and a plurality of spare cells. In example embodiments, the second conductive pattern 98 may be common to the first and second memory cell layers 120 and 122. The first and second memory cell layers 120 and 122 may correspond to the memory modules 30a and 30b illustrated in FIG. 5, respectively. In addition, referring to FIG. 26, a memory cell in which data 1 is recorded may be disposed in the first memory cell layer 120.

Figure 27:
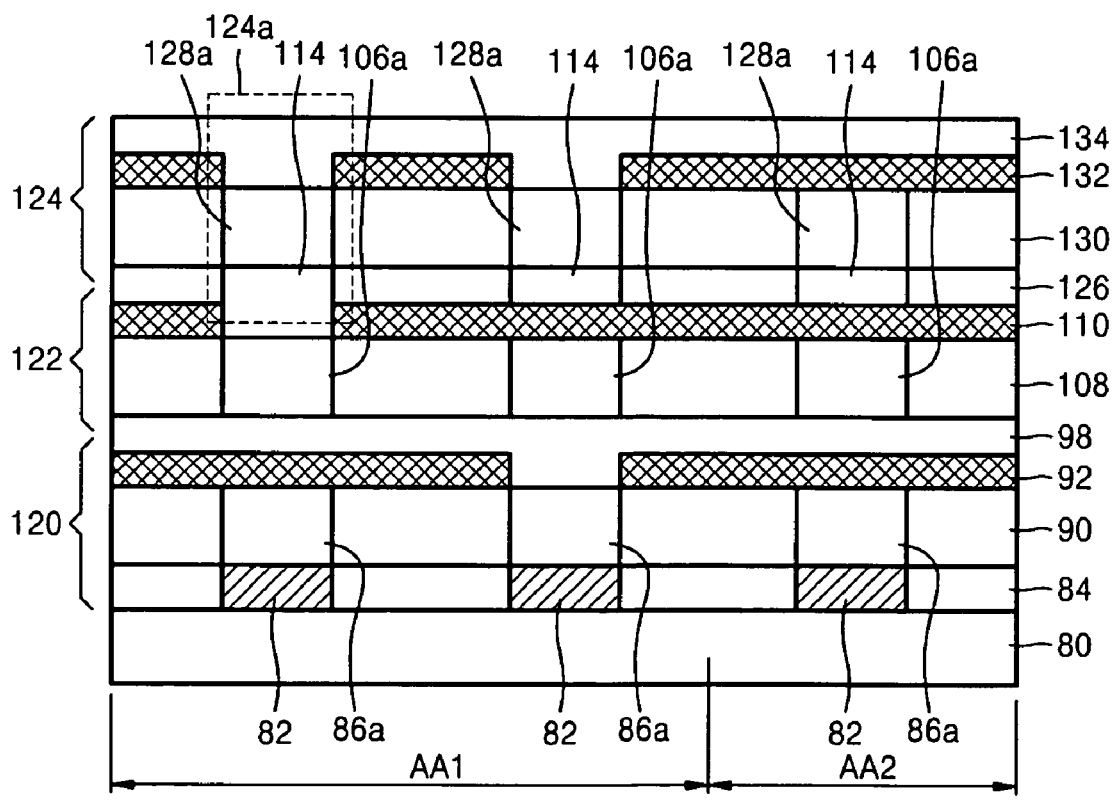

As illustrated in FIG. 27, a third memory cell layer 124, which shares the third conductive pattern 114 with the second memory cell layer 122, may be formed on the second memory cell layer 122. The third memory cell layer 124 may correspond to the third memory module 30c illustrated in FIG. 5. The third memory cell layer 124 may be formed using the same method as that for forming the second memory cell layer 122. Fourth and fifth memory cells (not shown) may be further formed on the third memory cell layer 124.

In FIG. 27, a fifth interlayer insulating layer 126 may fill spaces between the third conductive patterns 114, and a sixth interlayer insulating layer 130 may fill spaces between third diodes 128a. In addition, a third insulating layer 132 may be the same as the insulating layer 92 or the second interlayer insulating layer 110. A fourth conductive pattern 134 may be the same as the second conductive pattern 98.

Figure 28:
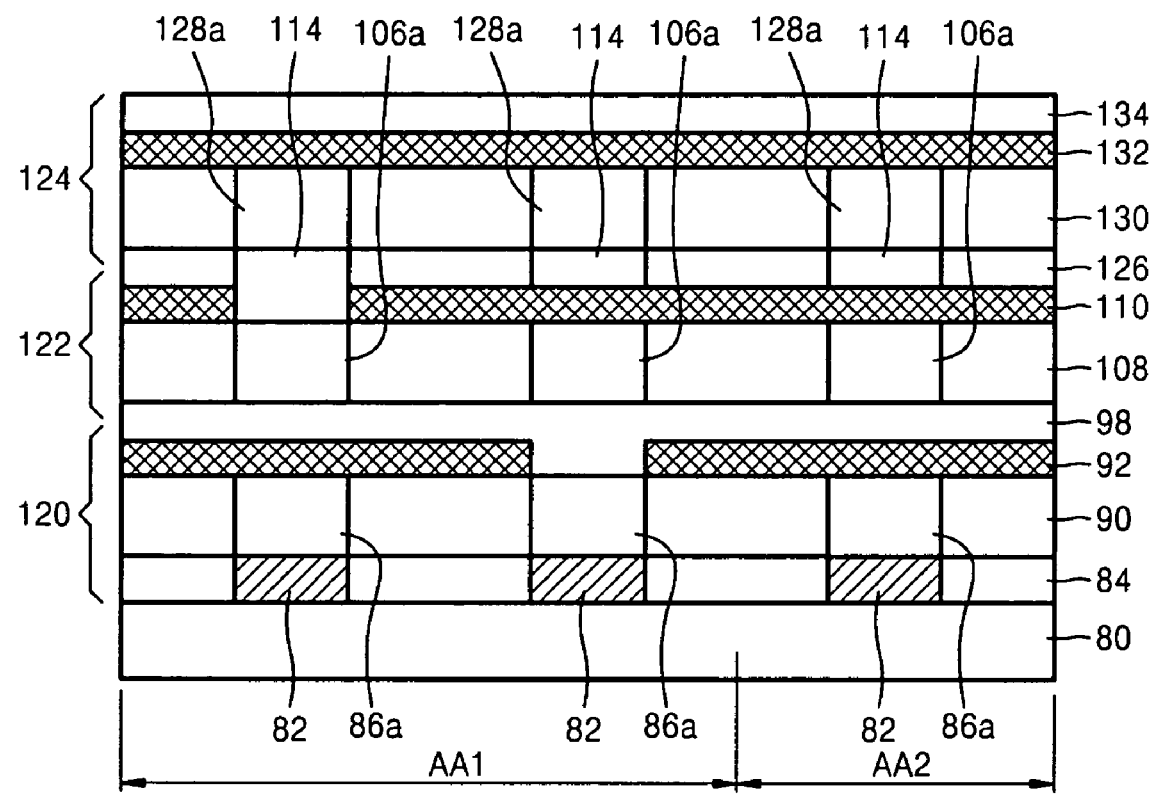

Any one layer of the memory cell layers 120, 122, and 124 may be formed as a spare cell layer, and the other two of the memory cell layers 120, 122, and 124 may be formed as a memory cell layer. FIG. 28 illustrates where the third memory layer 124 may be formed as a spare cell layer. Referring to FIG. 28, in the third memory cell layer 124, a third insulating layer 132 may be formed between the third diodes 128a and a fourth conductive pattern 134. The stacked first and second memory cell layers 120 and 122 may share the second conductive pattern 98, and the second and third memory cell layers 122 and 124 may share the third conductive pattern 114. The memory cell layers 120, 122, and 124 may be independently formed.

Figure 29:
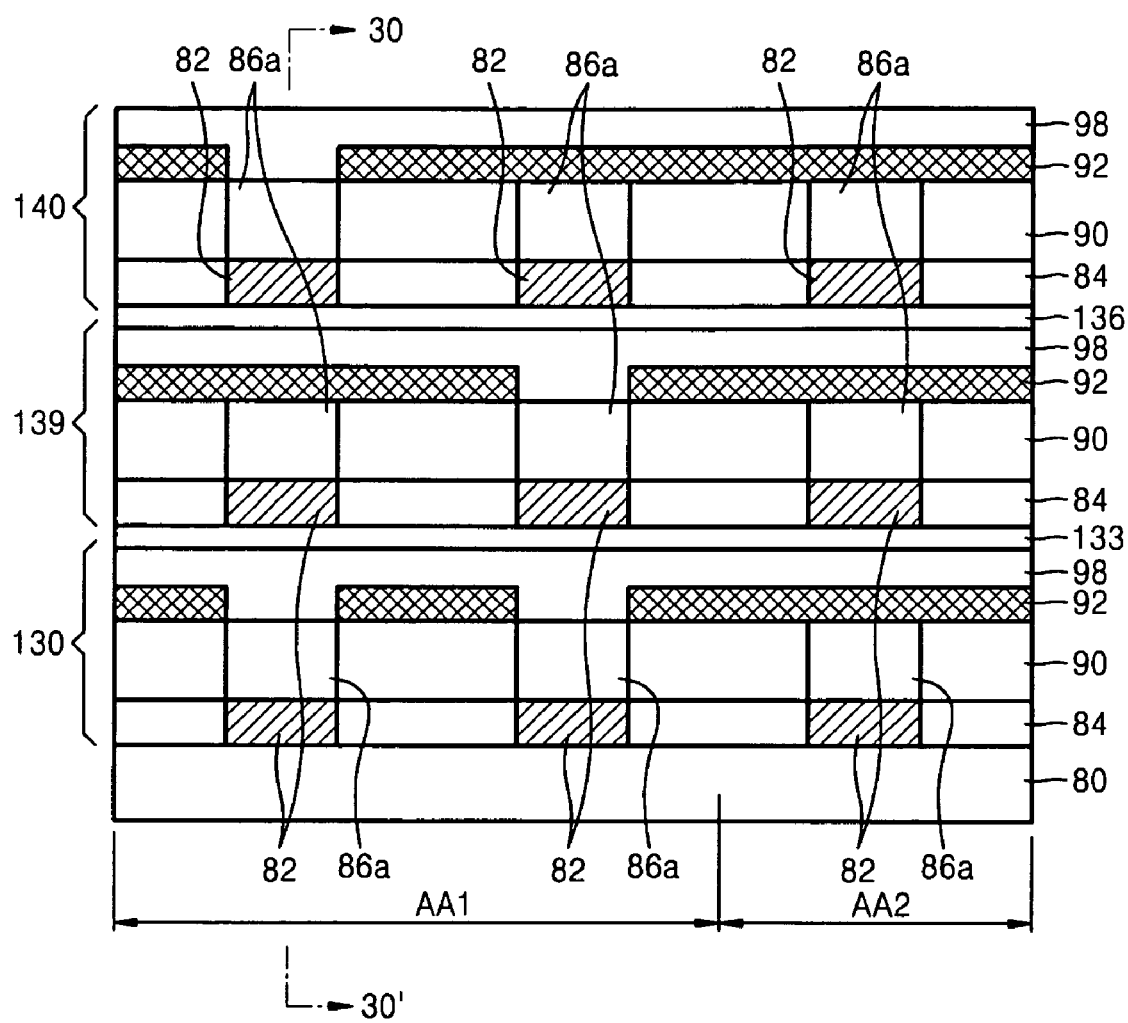

Referring to FIG. 29, a first memory cell layer 130 may be formed on the substrate 80. The first memory layer 130 may be the same as the first memory cell layer 120 illustrated in FIG. 27. Thus, the first memory cell layer 130 may be formed using the same method as that for forming the first memory cell layer 120. A second substrate 133 may be formed on the first memory cell layer 130. The second substrate 133 may be an insulating layer. A second memory cell layer 139 may be formed on the second substrate 133. The second memory cell layer 139 may be the same as the first memory cell layer 130. However, in the first area AA1 of each memory cell layer, the contact state between the diodes 86a and the conductive pattern 98, for example, the number and positions of the diodes 86a in contact with the conductive pattern 98, may be changed. A third substrate 136 may be formed on the second memory cell layer 139. The third substrate 136 may be an insulating layer. A third memory cell layer 140 may be formed on the third substrate 136. The third memory cell layer 140 may be the same as the first memory cell layer 130. In the memory cell layers 130, 134 and 140, the diodes 86a of each memory cell layer may be the same as or different from each other. The memory cell layers 130, 134, and 140 may correspond to the memory modules 30a, 30b, and 30c illustrated in FIG. 5, respectively.

Figure 30:
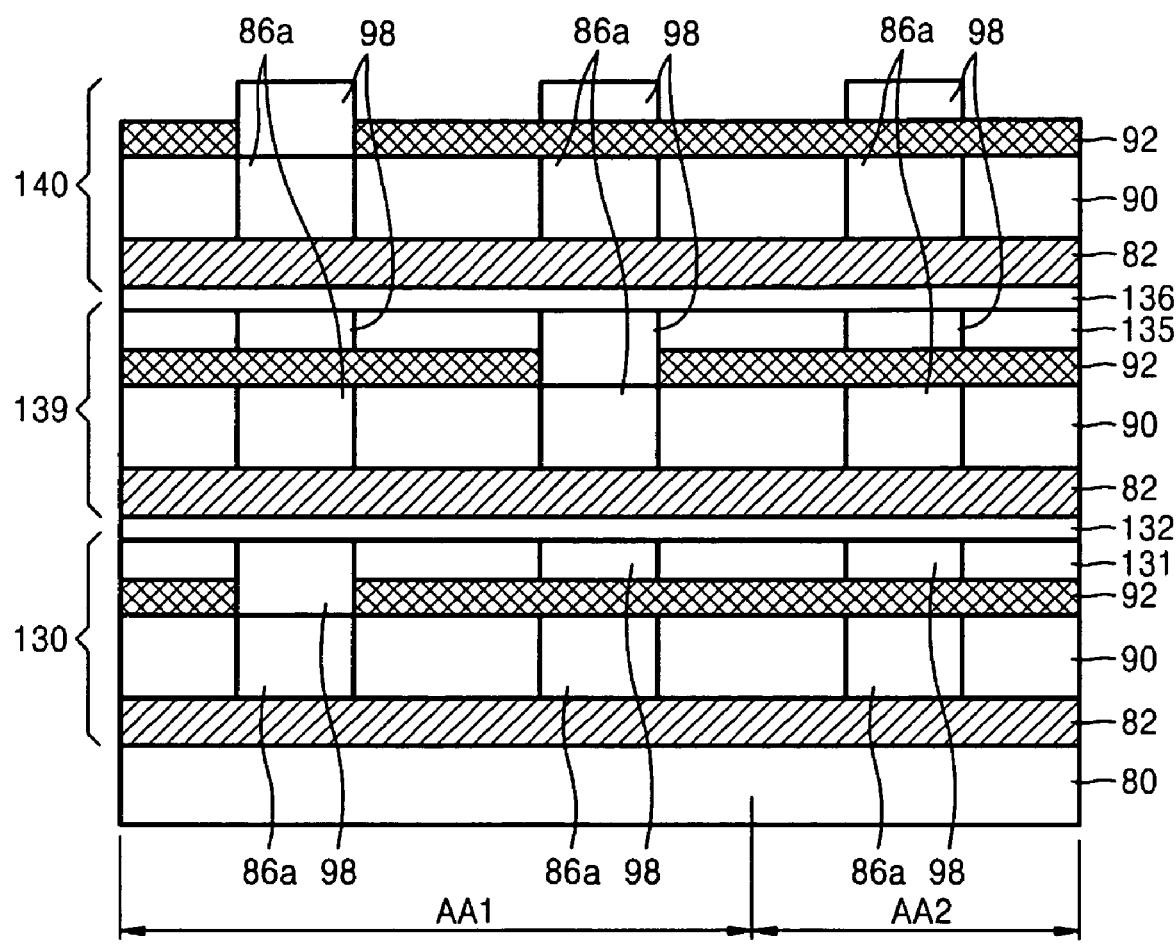

FIG. 30 is a cross-sectional view of a structure taken along a line 30-30' of FIG. 29. In FIG. 30, interlayer insulating layers 131 and 135 may fill spaces between the second conductive patterns 98.

Figure 31:
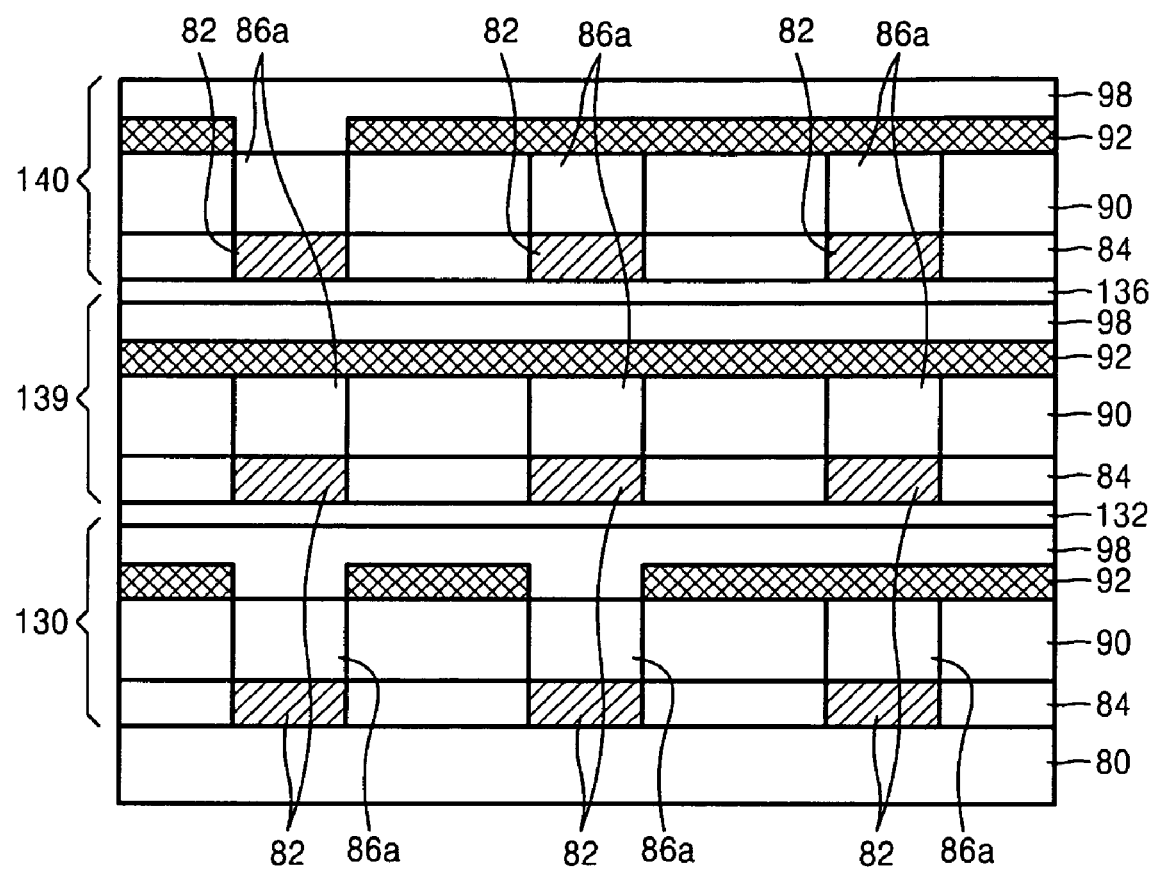

In FIG. 29, any one of the memory cell layers 130, 134, and 140, for example, the second memory cell layer 139 may be a spare cell layer including only a spare cell, and the other two of the memory cell layers 130, 134 and 140 may each be a memory cell having no spare cell. FIG. 31 illustrates the second memory cell layer 139 illustrated in FIG. 29 having a spare cell layer and the first and third memory cell layers 130 and 140 illustrated in FIG. 29 each do not include a spare cell.

In addition, a portion of each of the memory cell layers 130, 134 and 140 may be used as a first memory module, and the remaining portion of each of the memory cell layers 130, 134 and 140 may be used as a second memory module. For example, in the first memory cell layer 120 or 130, a memory cell layer for forming a memory module may be formed in the first area AA1, and a memory cell layer for forming another memory module may be formed in the second area AA2. Each of the memory cell layers may include a memory cell for programming and a spare cell.

During forming a result of FIG. 27 or FIG. 29, when a memory cell in which data cannot be recorded is not found from among memory cells included in the first area AA1, that is, when all desired data is accurately recorded in the first area AA1, using a spare cell may not be necessary in the second area AA2, because the second area AA2 is not changed as illustrated in FIG. 27 or 29, thereby completing the method of manufacturing a memory module.

When the method is completed, although the production is different according to the size of a substrate, a large number of, for example, several ten thousand of memory modules may be obtained. The memory modules, an interface, a controller and an operation enhancing unit may be connected to each other, thereby completing a memory device. The memory interface and the controller together with the memory modules may be formed on a substrate.

Alternatively, the memory interface and the controller may be separately manufactured together with a main interface, or may be manufactured in relatively large quantities as in the memory module. Because electrically connecting the memory module is relatively simple work, the memory interface, the controller, the main interface and the operating enhancing unit may be completed in a relatively short period of time.

Likewise, because elements of a memory device according to example embodiments are simultaneously manufactured in large quantities, and a relatively short period of time is taken to electrically connect the manufactured elements, a relatively short period of time may be required to produce the memory device according to example embodiments.

During forming the result of FIG. 27 or FIG. 29, when a memory cell (hereinafter, referred to as a defective cell) in which data cannot be recorded is found from among memory cells included in the first area AA1, data to be recorded in the defective cell may be recorded in one cell in the second area AA2 in order to replace the defective cell.

Hereinafter, this operation will be described. In FIG. 27, a memory cell 124a illustrated as the leftmost one in the third memory cell layer 124 illustrated is the defective cell, but example embodiments are not limited thereto. In addition, in FIG. 27, data 1 has been recorded in the defective cell 124a or that data 1 is to be recorded in the defective cell 124a. The defective cell 124a may be replaced by a spare cell 124b of the second area AA2, as illustrated in FIG. 32.

Figure 32:
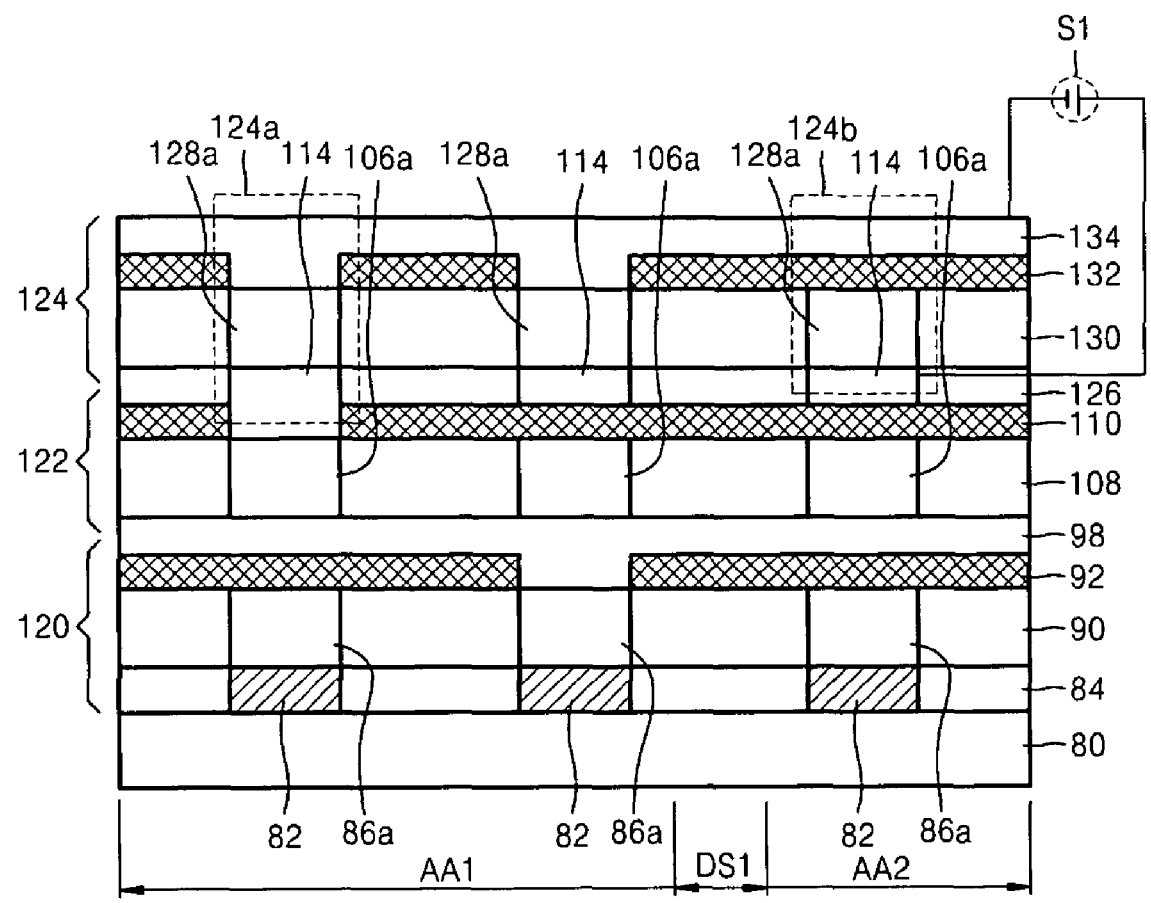
FIG. 32 is a cross-sectional view illustrating where a defective cell of a program area is replaced by a memory cell from a spare area.

In FIG. 32, a process of replacing the defective cell 124a with the spare cell 124b may be considered as a process of recording data 1 in the spare cell 124b. In order to record data 1 in the spare cell 124b, a voltage may be applied to the third conductive pattern 114 and the fourth conductive pattern 134 by connecting a power source S1 between a lower electrode (e.g., the third conductive pattern 114) and an upper electrode (e.g., the fourth conductive pattern 134) which cross each other and have the spare cell 124b therebetween. The voltage may be a voltage at which the insulation of the third insulating layer 132 formed between the third diodes 128a and the fourth conductive pattern 134 of the spare cell 124b is broken. Thus, the voltage may be changed according to an insulating material used for forming the third insulating layer 132 and the thickness of the third insulating layer 132.

Due to applying the voltage, because insulation of the third insulating layer 132 formed between the spare cell 124b and the fourth conductive pattern 134 is broken, after applying the voltage, the resistance of the spare cell 124b may be reduced to a resistance level of a memory cell of the first area AA1, in which data 1 is recorded. Likewise, the defective cell 124a of the first area AA1 may be replaced with the spare cell 124b of the second area M2. In a reading operation to read the defective cell 124a, the spare cell 124b of the second area AA2 may be selected and read.

When the defective cell 124a is a memory cell in which data 0 is recorded or data 0 is to be recorded, the resistance of the defective cell 124a may be the same as the spare cell 124b. Thus, in example embodiments, applying a voltage for breaking the insulation of the third insulating layer 132 may be necessary and also the spare cell 124b may be read in a reading operation to read the defective cell 124a.

As illustrated in FIG. 29, when memory cell layers are separated by insulating layers, defective memory cells of the first area AA1 may be replaced with spare cells of the second area AA2 by using the above-described method. In addition, as illustrated in FIGS. 28 and 31 when an entire portion of a predetermined or given memory cell layer of memory cell layers is used as a spare layer, a defective memory cell of each memory cell layer may also be replaced with a predetermined or given spare cell of the spare layer by using the above-described method. In addition, even when two memory modules are included in a single memory cell, the above-described replacing method may also be used.

According to the method of manufacturing a memory device according to example embodiments, because a defective cell generated when the memory device is manufactured may be replaced with a spare cell, factors leading to operational errors of a finished product may be removed.

The above-described manufacturing method may be modified in various forms. For example, in FIG. 15, rather than forming the conductive pattern 82, a conductive layer may be patterned into the first conductive pattern 82, the diode layer 86 may be deposited on the conductive layer, the diode layer 86 and the conductive layer may be etched in the same linear shape as the conductive pattern 82 by etching the diode layer 86 and the conductive layer in the reverse order, and then the etching operation of dividing the diode layer 86 on a cell-by-cell basis may be performed. Thus, a diode may be formed on a cell-by-cell basis, and then, an insulating layer may be formed on a selected diode, that is, a diode disposed in a cell in which data 0 is to be recorded.

Figure 33:
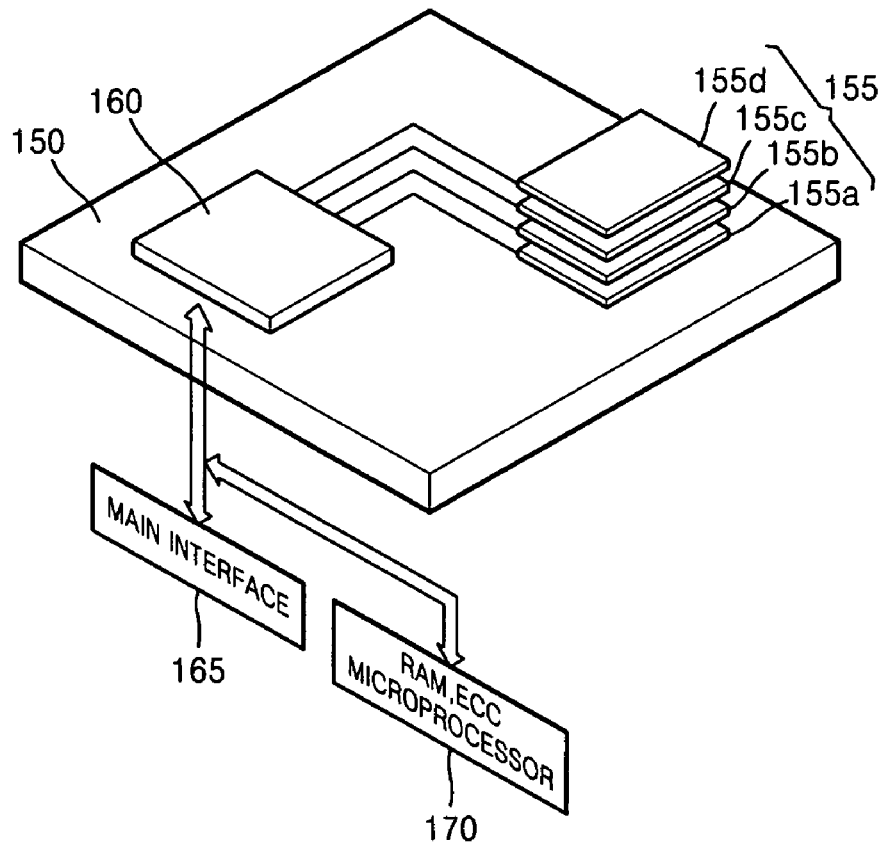
FIG. 33 illustrates a memory device manufactured using a method according to example embodiments.

FIG. 33 illustrates a semiconductor memory device including the above-described memory cell layer or memory module as a data storage unit 155, according to example embodiments.

Referring to FIG. 33, the data storage unit 155, a memory interface and a controller 160 may be formed on a substrate 150. The data storage unit 155 may include memory modules 155*a* through 155*d* that are sequentially stacked. Each of the memory modules 155*a* through 155*d* may be a memory cell layer including the first area AA1 together with the second area AA2. In addition, any one selected from the memory modules 155*a* through 155*d*, for example, the fourth memory module 155*d* may be a spare cell layer including only a spare cell, and the others of the first through fourth memory modules 155*a* through 155*d* may be a memory cell layer including only a memory cell. In addition, all of the memory modules 155*a* through 155*d* may be memory cell layers, and a spare cell layer may be disposed outside the data storage unit 155.

In all cases, data may be recorded in a memory cell of the memory modules 155*a* through 155*d*. However, the memory modules 155*a* through 155*d* may be in a state in which data is not recorded so that a user may directly record data.

When the memory modules 155*a* through 155*d* are in a state in which data is not recorded so that a user may directly record data, the semiconductor memory device may include a repairing circuit for replacing a defective cell during the recording of the data. The repairing circuit may be disposed in the memory module or outside the data storage unit 155. In addition, the repair circuit may be disposed in a display that will be described later.

When data is or is being recorded in the memory modules 155*a* through 155*d*, data corresponding to ¼ of information included in one scene of a movie is recorded in each of the memory modules 155*a* through 155*d* with respect to information to be simultaneously displayed, for example, one scene of the movie. When the number of memory modules of the data storage unit 155 is ten, data corresponding to ⅒ of information included in the one scene of the movie is recorded in each of the memory modules.

Data recorded in the memory modules 155*a* through 155*d* may be simultaneously reproduced by the memory interface and the controller 160. Thus, a period of time required to reproduce the one scene of the movie may be reduced to one-fourth of a period of time required to reproduce the one scene of the movie using one memory module according to a conventional method. The more the member of the stacked memory modules is increased, the more reduced a period of time to reproduce. A reduced period of time taken to reproduce data denotes that a larger amount of information may be reproduced in a unit period of time.

In particular, when data is reproduced from a selected one of the memory modules 155*a* through 155*d*, the data transmission rate at which data is transferred from the selected memory module is 10 MB/s at which data is transferred in a general semiconductor memory device. As described above, because data recorded in the memory modules 155*a* through 155*d* is simultaneously reproduced, one scene of the movie that is divided into ¼ and recorded in the memory modules 155*a* through 155*d* may be reproduced at a transmission rate of 40 MB/s. A data transmission rate of 39 MB/s is required to obtain an image quality of digital versatile disc (DVD) level. Because the data transmission rate of the memory device according to example embodiments may be equal to or greater than about 40 MB/s, the memory device according to example embodiments may realize an image quality of a DVD level. In addition, in the memory device according to example embodiments, the data storage unit 155 may include memory modules configured as a stack structure, thereby reducing the size of the memory device, as illustrated in FIG. 5 or 33.

In FIG. 33, the memory interface and the controller 160 may be separately formed rather than being formed on the substrate 150. A main interface 165 may be connected to or contact a display apparatus on which data recorded in the data storage unit 155 is displayed. The display apparatus may be a television or projector having a part in which the memory device illustrated in FIG. 33 is inserted, or a portable display apparatus having the port.

Figure 34:
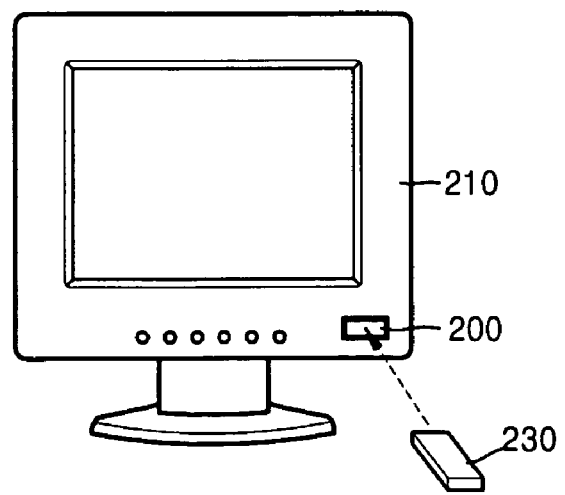
FIG. 34 illustrates a television including the memory device illustrated in FIG. 1 or 33.

FIG. 34 illustrates a television 210 including a port 200, as an example of the display apparatus. In FIG. 34, a reference number 230 refers to the memory device illustrated in FIG. 1 or FIG. 33. The port 200 may have a depth corresponding to the entire length of the memory device illustrated in FIG. 33. In addition, only the main interface 165 may be connected to the port 200. The port 200 may have a depth corresponding to a partial length of the memory device including the main interface 165. The port 200 may be disposed at various positions as well as a position illustrated in FIG. 34. When a memory device 230 is connected to the port 200, a signal output by the memory device 230 is converted to a video signal using a similar method to a method used when a compact disc, a DVD, or a magnetic recording medium is used.

Thus, data may be transferred from the memory device 230 to the television 210. Because the memory device 230 includes a controller inside thereof, a reproducing rate may be controlled during reproduction of data, and a reproducing position may be quickly moved back and forth. Such a function may be performed using a remote controller. Likewise, when the memory device 230 is used, an additional line for connecting the memory device 230 to the television 210 may not be necessary.

Referring back to FIG. 33, an operation enhancing unit 170 may include a micro processor for sequentially reading data recorded in the data storage unit 155, a memory element for temporally storing data transmitted from the data storage unit 155 in order to increase a data transmission rate, e.g., a static random access memory (SRAM), and an error check correction (ECC) that is a means for accurately reading data. The operation enhancing unit 170 may further include a support element for quickly and accurately performing reproduction of data, and may further include an element for supporting a recording operation and a copy prevention element, if necessary. The copy prevention element may be provided to a memory interface and the controller 160.

The copy prevention element may be recorded in the form of a mask ROM in the data storage unit 155 as a copy prevention program. In addition, the memory device according to example embodiments may further comprise a switching function or a jump function, when a switching function or a jump function is embodied, the memory device may be prevented or retarded from being operated in an image reproducing apparatus, e.g., a television. Because the memory interface and the controller 160 include the repairing circuit, the memory interface and the controller 160 may lead an operation of replacing a defective cell with a spare cell.

While example embodiments have been particularly shown and described with reference to example embodiments thereof, it will be understood by one of ordinary skill in the art that various changes in form and details may be made therein without departing from the spirit and scope as defined by the following claims. For example, the memory device and the display apparatus may be connected using a cable instead of using the port. Also, data recorded in the memory device may be transmitted to the display apparatus via a wireless method. Also, a method of recording data may differ according to a kind of data.

What is claimed is:

1. A memory device capable of only one-time data writing and repeated data reproduction comprising:
a program area including a plurality of memory cells; and
a spare area including a plurality of memory cells,
wherein at least one of at least two vertically stacked memory modules includes only the program area, and another of the at least two vertically stacked memory modules includes only the spare area.

2. The memory device of claim 1, wherein the at least two memory modules constitute one or more memory module units, wherein each of the units including two or more memory modules.

3. The memory device of claim 1, wherein at least one memory module selected from among the at least two memory modules includes at least two separate memory modules horizontally disposed to one another.

4. The memory device of claim 1, wherein data is dispersedly recorded in the program area and the spare area, and
wherein less than about 50% of the data is recorded in the spare area.

5. A display apparatus comprising a port configured to connect to the memory device of claim 4.

6. The memory device of claim 1, wherein all of the memory cells of the program area and the spare area are in an off-state, or a portion of the memory cells of the program area and the spare area is in an on-state, and the others of the memory cells of the program area and the spare area is in an off-state.

7. A display apparatus comprising a port configured to connect to the memory device of claim 6.

8. The memory device of claim 1, further comprising:
a memory interface and controller connected to the memory module; and
a main interface connected to the memory interface and controller and to an external display element.

9. The memory device of claim 8, further comprising:
an operation enhancing unit enhancing an operation of the memory device between the memory interface and controller and the main interface.

10. A display apparatus comprising a port configured to connect to the memory device of claim 8.

11. The memory device of claim 1, wherein the at least two memory modules share a wiring.

12. The memory device of claim 1, wherein an insulating layer is between the at least two memory modules.

13. The memory device of claim 1, wherein each of the memory cells includes two wirings, a diode and an insulating layer sequentially stacked between the two wirings, or a portion of the memory cells includes only the two wirings and a diode between the two wirings.

14. The memory device of claim 13, wherein the diode is one of a PN diode, a Schottky diode, and a back-to-back diode.

15. A display apparatus comprising a port configured to connect to the memory device of claim 1.

16. The display apparatus of claim 15, wherein the port has a depth corresponding to the entire length or a partial length of the memory device.

17. The display apparatus of claim 15, wherein the port and the memory device are connected through a cable.

18. A method of operating a memory device capable of only one-time data writing and repeated data reproduction comprising:
providing a program area including a plurality of memory cells, and a spare area including a plurality of memory cells, wherein at least one of at least two vertically stacked memory modules includes only the program area, and another of the at least two vertically stacked memory modules includes only the spare area; and
simultaneously reading data from the at least two memory modules.

19. The method of claim 18,
wherein a part of the data is recorded in the spare area.

20. The method of claim 18,
wherein a portion of the data is recorded in the spare area.

21. A method of operating a memory device capable of only one-time data writing and repeated data reproduction comprising:
providing a program area including a plurality of memory cells, and a spare area including a plurality of memory cells, wherein at least one of at least two vertically stacked memory modules includes only the program area, and another of the at least two vertically stacked memory modules includes only the spare area; and
dispersedly recording data in the at least two memory modules.

22. The method of claim 21, further comprising:
recording a portion of the data in the spare area.

23. The method of claim 22, wherein recording the portion of the data in the spare area comprises:
checking for the data incorrectly recorded from among data dispersedly recorded in the at least two memory modules; and
recording correct data corresponding to the data incorrectly recorded in the spare area.

* * * * *